(12) United States Patent
Lee et al.

(10) Patent No.: US 11,205,652 B2
(45) Date of Patent: Dec. 21, 2021

(54) SEMICONDUCTOR MEMORY DEVICE AND METHOD OF FABRICATING THE SAME

(71) Applicant: Samsung Electronics Co., Ltd., Suwon-si (KR)

(72) Inventors: Dongjun Lee, Anyang-si (KR); Sang Chul Shin, Yongin-si (KR); Bong-Soo Kim, Yongin-si (KR); Jiyoung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/506,316

(22) Filed: Jul. 9, 2019

(65) Prior Publication Data

US 2020/0203354 A1   Jun. 25, 2020

(30) Foreign Application Priority Data

Dec. 24, 2018  (KR) ........................ 10-2018-0168250

(51) Int. Cl.
  *H01L 27/108*   (2006.01)
  *G11C 5/06*   (2006.01)
  (Continued)

(52) U.S. Cl.
  CPC ........ *H01L 27/10885* (2013.01); *G11C 5/063* (2013.01); *H01L 21/7682* (2013.01); *H01L 23/5283* (2013.01); *H01L 27/10805* (2013.01); *H01L 27/10814* (2013.01); *H01L 27/10847* (2013.01); *H01L 27/10855* (2013.01);
  (Continued)

(58) Field of Classification Search
  CPC ......... H01L 27/10805; H01L 27/10814; H01L 27/10885; H01L 27/10888; H01L 29/0649; H01L 23/5329; H01L 27/24; H01L 27/22; H01L 27/2436; H01L 27/228
  See application file for complete search history.

(56) References Cited

U.S. PATENT DOCUMENTS 6,316,348 B1   11/2001  Fu et al.
7,851,350 B2   12/2010  Cho et al.
(Continued)

FOREIGN PATENT DOCUMENTS

KR   200731678   *   3/2007

OTHER PUBLICATIONS

Machine translated document "MTD" (Year: 2007).*

*Primary Examiner* — Ahmed N Sefer
(74) *Attorney, Agent, or Firm* — Harness, Dickey & Pierce

(57) ABSTRACT

A semicondcutor memory device may include a substrate, a bit line structure extending in one direction on the substrate, the bit line structure including a sidewall, a storage node contact on the sidewall of the bit line structure, first and second spacers between the sidewall of the bit line structure and the storage node contact, the first spacer separated from the second spacer by a space between the first spacer and the second spacer, an interlayer dielectric layer on the bit line structure, the interlayer dielectric layer including a bottom surface, a spacer capping pattern extending downward from the bottom surface of the interlayer dielectric layer toward the space between the first and second spacers, and a landing pad structure penetrating the interlayer dielectric layer, the landing pad structure coupled to the storage node contact.

19 Claims, 34 Drawing Sheets

(51) Int. Cl.
  *H01L 21/768*   (2006.01)
  *H01L 23/528*   (2006.01)
(52) U.S. Cl.
  CPC .. *H01L 27/10876* (2013.01); *H01L 27/10888* (2013.01); *H01L 27/10891* (2013.01); *H01L 21/76897* (2013.01)

(56) References Cited

U.S. PATENT DOCUMENTS

| | | |
|---|---|---|
| 9,356,073 B1 | 5/2016 | Kim |
| 9,576,902 B2 | 2/2017 | Park et al. |
| 9,997,521 B2 | 6/2018 | Kim et al. |
| 2015/0061134 A1* | 3/2015 | Lee .................. H01L 21/76895 257/751 |
| 2017/0005097 A1* | 1/2017 | Kim .................... H01L 21/7682 |
| 2018/0012894 A1* | 1/2018 | Kim .................. H01L 27/10814 |
| 2018/0040560 A1 | 2/2018 | Kim et al. |
| 2018/0174971 A1 | 6/2018 | Song et al. |
| 2018/0175040 A1 | 6/2018 | Kim et al. |
| 2018/0286870 A1* | 10/2018 | Kim ................. H01L 27/10885 |
| 2019/0164975 A1* | 5/2019 | Song ................ H01L 27/10814 |

\* cited by examiner

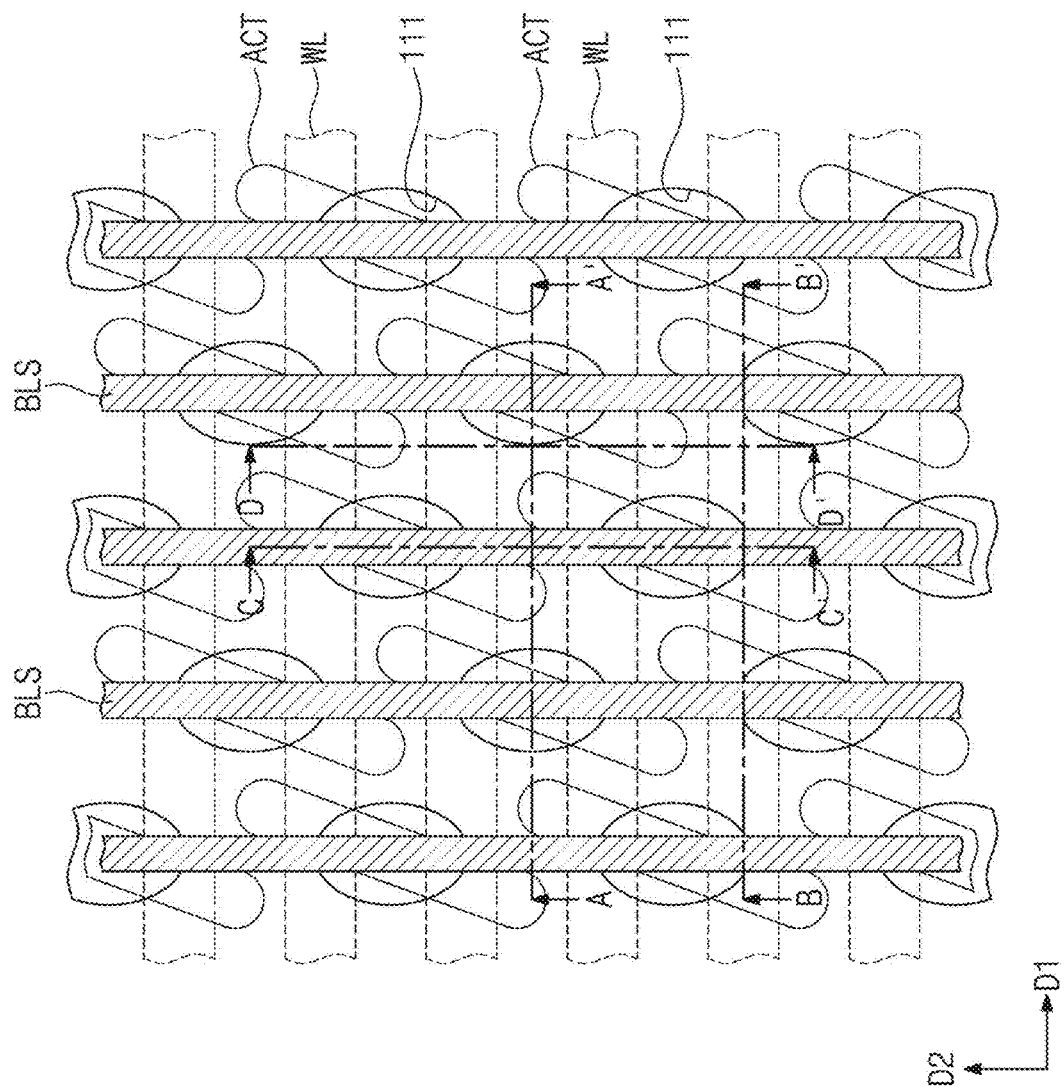

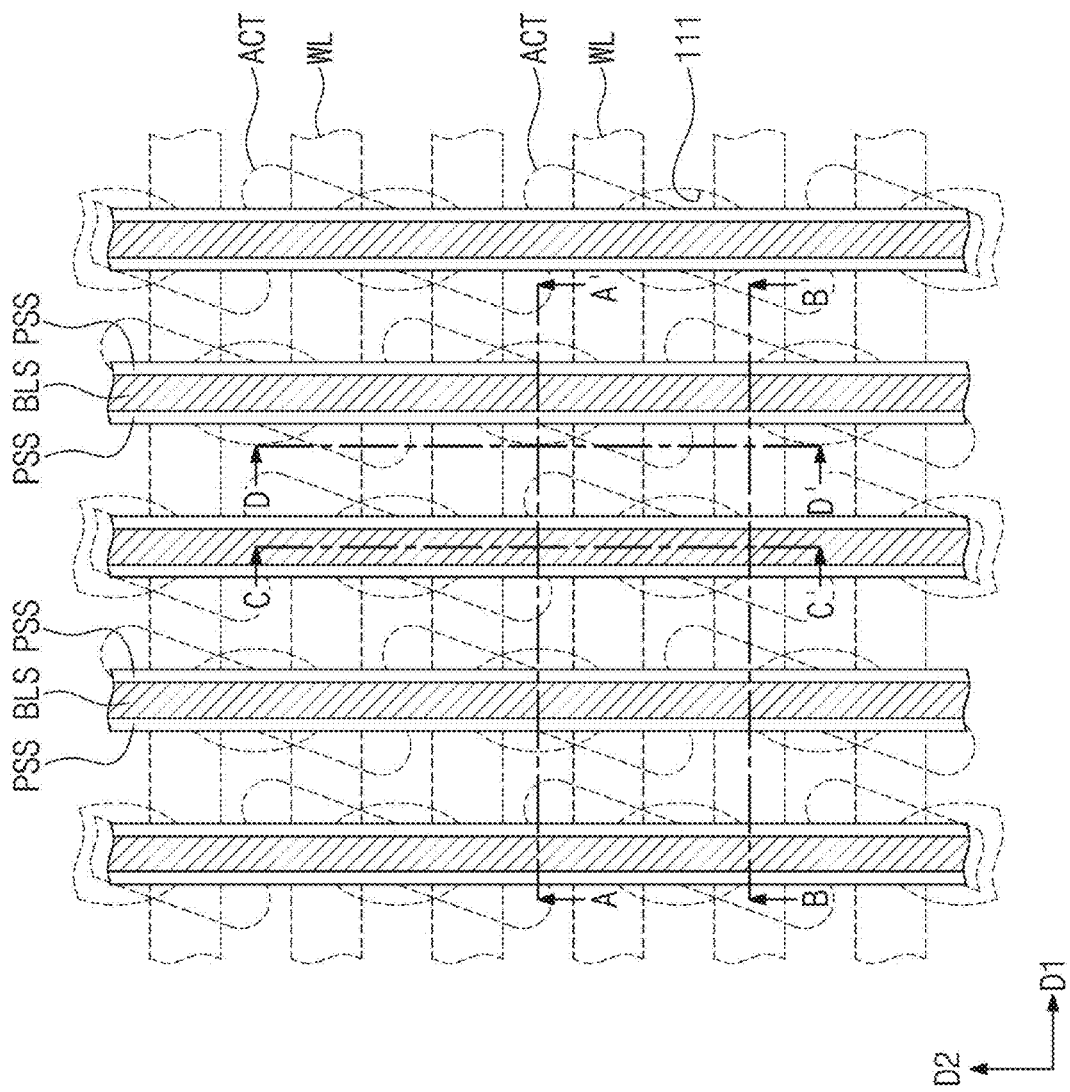

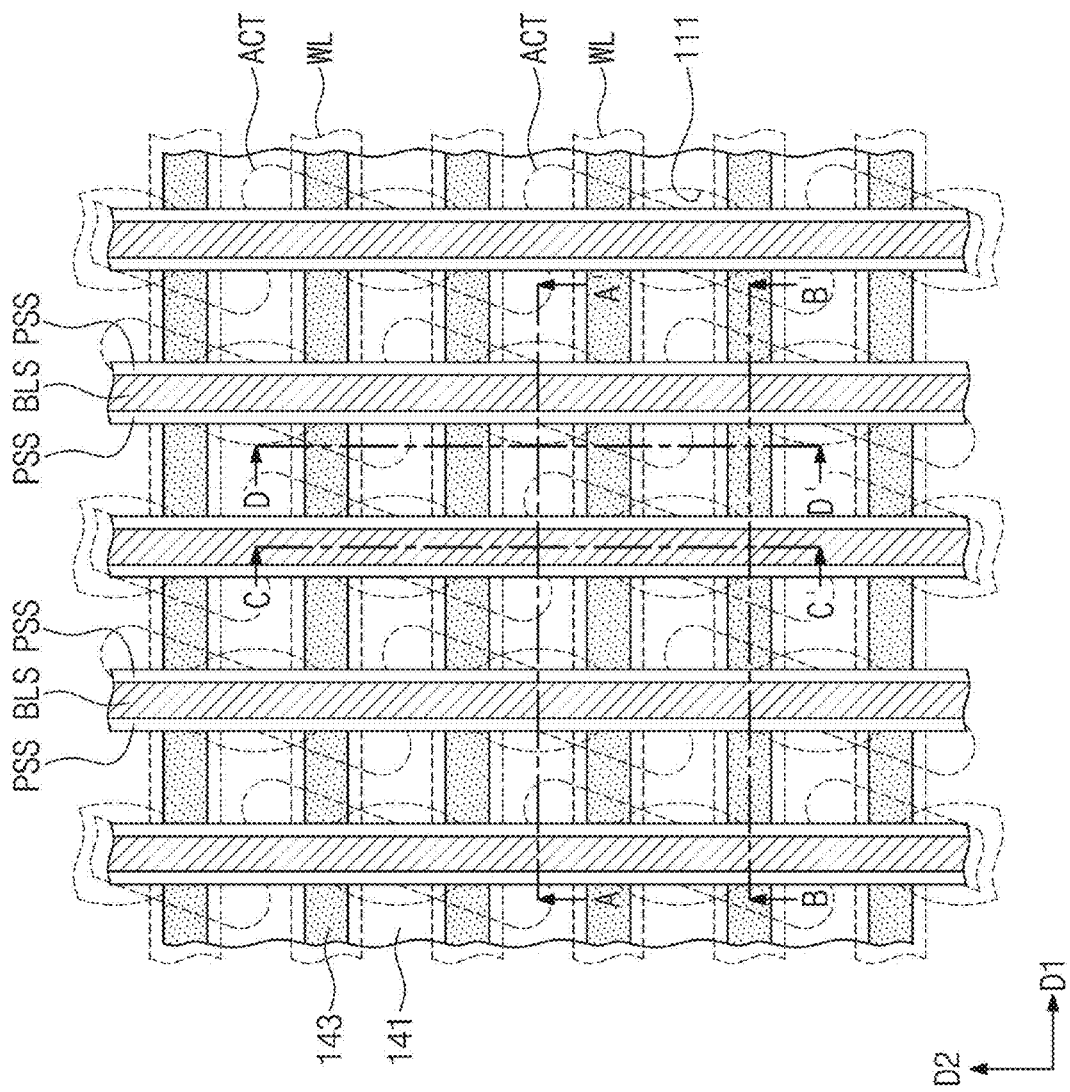

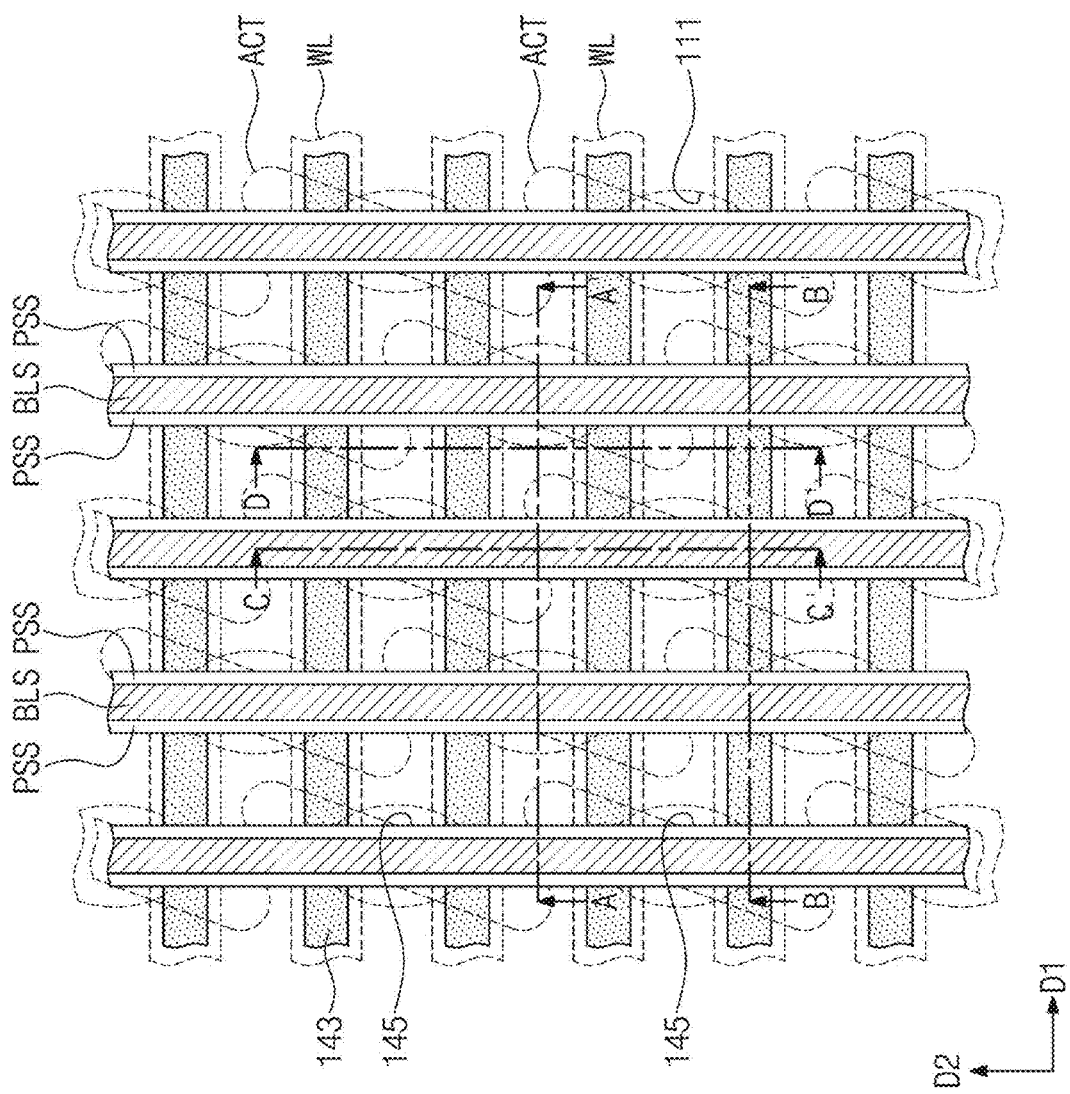

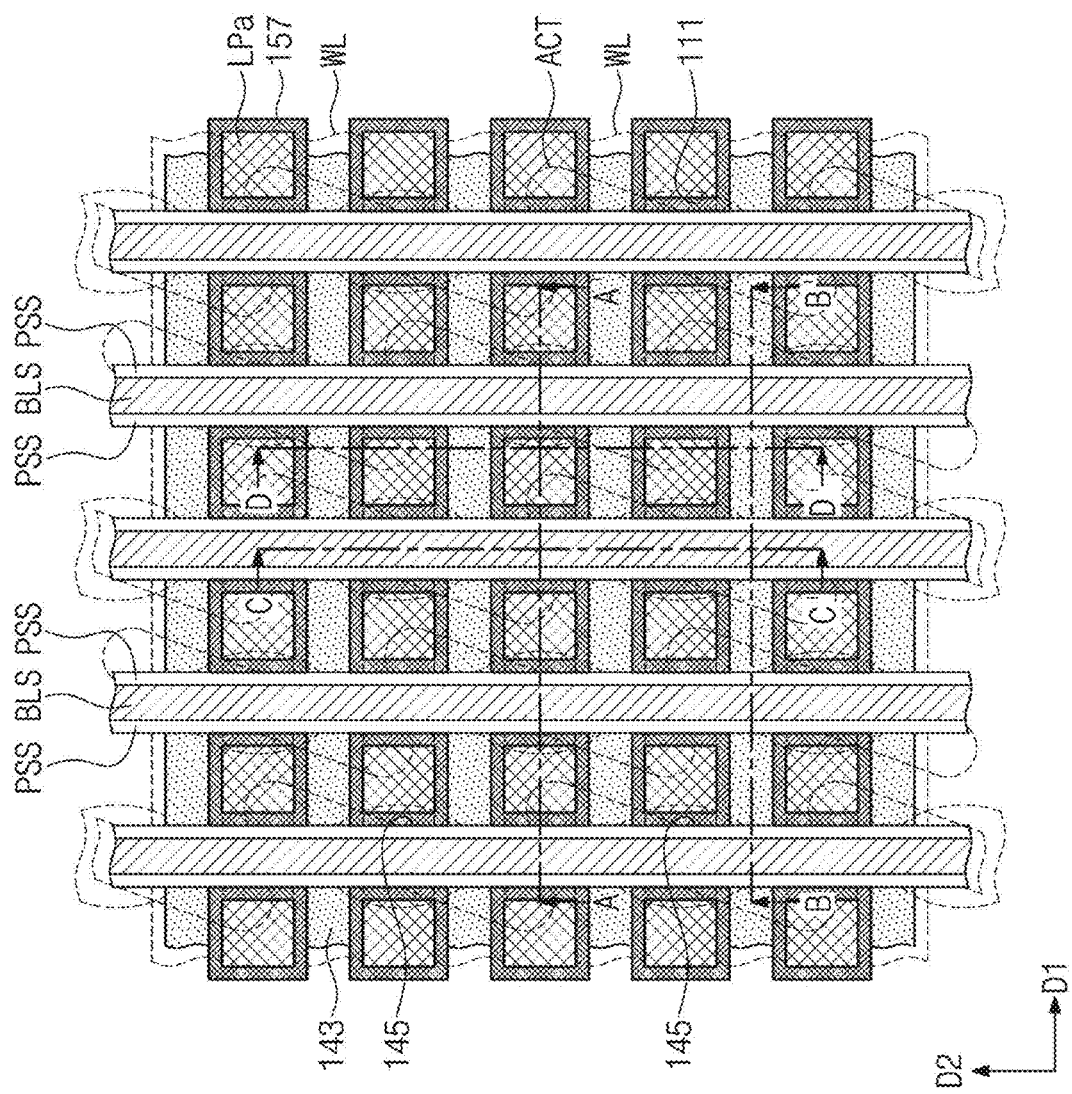

SEMICONDUCTOR MEMORY DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2018-0168250 filed on Dec. 24, 2018 in the Korean Intellectual Property Office, the entire contents of which are hereby incorporated by reference.

BACKGROUND

Inventive concepts relate to a semiconductor memory device and/or a method of fabricating the same, and more particularly, to a semiconductor memory device including a spacer structure having an air gap and/or a method of fabricating the same.

Semiconductor devices are considered to be an important factor in the electronic industry because of their small size, multi-functionality, and/or low fabrication cost. Semiconductor devices have increasingly been integrated with the development of electronic industry. For example, line widths of patterns of semiconductor devices are being reduced for high integration thereof. However, new exposure techniques and/or expensive exposure techniques are required for fineness of the patterns such that it is difficult to highly integrate semiconductor devices. Therefore, various researches have recently been conducted for new integration techniques.

SUMMARY

Some example embodiments of inventive concepts provide a semiconductor memory device with improved reliability and a method of fabricating the same.

An object of inventive concepts is not limited to the mentioned above, and other objects which have not been mentioned above will be clearly understood to those of ordinary skill in the art from the following description.

According to some example embodiments of inventive concepts, a semiconductor memory device may include a substrate, a bit line structure extending in one direction on the substrate, the bit line structure including a sidewall, a storage node contact on the sidewall of the bit line structure, first and second spacers between the sidewall of the bit line structure and the storage node contact, the first spacer separated from the second spacer by a space between the first spacer and the second spacer, an interlayer dielectric layer on the bit line structure, the interlayer dielectric layer including a bottom surface, a spacer capping pattern extending downward from the bottom surface of the interlayer dielectric layer toward the space between the first and second spacers, and a landing pad structure penetrating the interlayer dielectric layer, the landing pad structure coupled to the storage node contact.

According to some example embodiments of inventive concepts, a semiconductor memory device may include a substrate including a first active region and a second active region, the first active region and the second active region spaced apart from each other, a bit line structure coupled to the first active region, the bit line structure running across the substrate, the bit line structure include a sidewall, a spacer structure on the sidewall of the bit line structure, an interlayer dielectric layer on the bit line structure and the spacer structure, and a landing pad structure penetrating the interlayer dielectric layer and electrically connected to the second active region. The landing pad structure includes a protrusion protruding toward the substrate, and a bottom end of the protrusion is located at a lower level than that of a top end of the spacer structure.

According to some example embodiments of inventive concepts, a semiconductor memory device may include a substrate, a pair of bit line structures on the substrate, the pair of bit line structures extending in parallel along one direction, a storage node contact, the storage node contact between the pair of bit line structures, a lower landing pad between the pair of bit line structures, the lower landing pad on the storage node contact, an interlayer dielectric layer on the pair of bit line structures and the lower landing pad, the interlayer dielectric layer including a bottom surface, and an upper landing pad penetrating the interlayer dielectric layer and coupled to the lower landing pad, the upper landing pad having a bottom end at a lower level than that the bottom surface of the interlayer dielectric layer.

According to some example embodiments of inventive concepts, a method of fabricating a semiconductor memory device may include forming a bit line structure on a substrate, forming a first spacer, a sacrificial spacer, and a second spacer, the first spacer, the sacrificial spacer, and the second spacer sequentially covering a sidewall of the bit line structure, forming a lower landing pad on a lateral surface of the second spacer, forming an air gap between the first spacer and the second spacer by removing the sacrificial spacer, forming an interlayer dielectric layer on the bit line structure and the lower landing pad, the interlayer dielectric layer filling an upper portion of the air gap, and forming an upper landing pad that penetrates the interlayer dielectric layer, the upper landing pad coupled to the lower landing pad.

BRIEF DESCRIPTION OF THE DRAWINGS

FIGS. 4A to 12A illustrate plan views showing a method of fabricating a semiconductor memory device according to some example embodiments of inventive concepts.

FIGS. 4B to 12B illustrate cross-sectional views taken along lines A-A' and B-B' of FIGS. 4A to 12A, showing a method of fabricating a semiconductor memory device according to some example embodiments of inventive concepts.

FIGS. 4C to 12C illustrate cross-sectional views taken along lines C-C' and D-D' of FIGS. 4A to 12A, showing a method of fabricating a semiconductor memory device according to some example embodiments of inventive concepts.

DETAILED DESCRIPTION OF EMBODIMENTS

The following will now describe in detail three-dimensional semiconductor memory devices according to some example embodiments of inventive concepts in conjunction with the accompanying drawings.

Figure 1A:
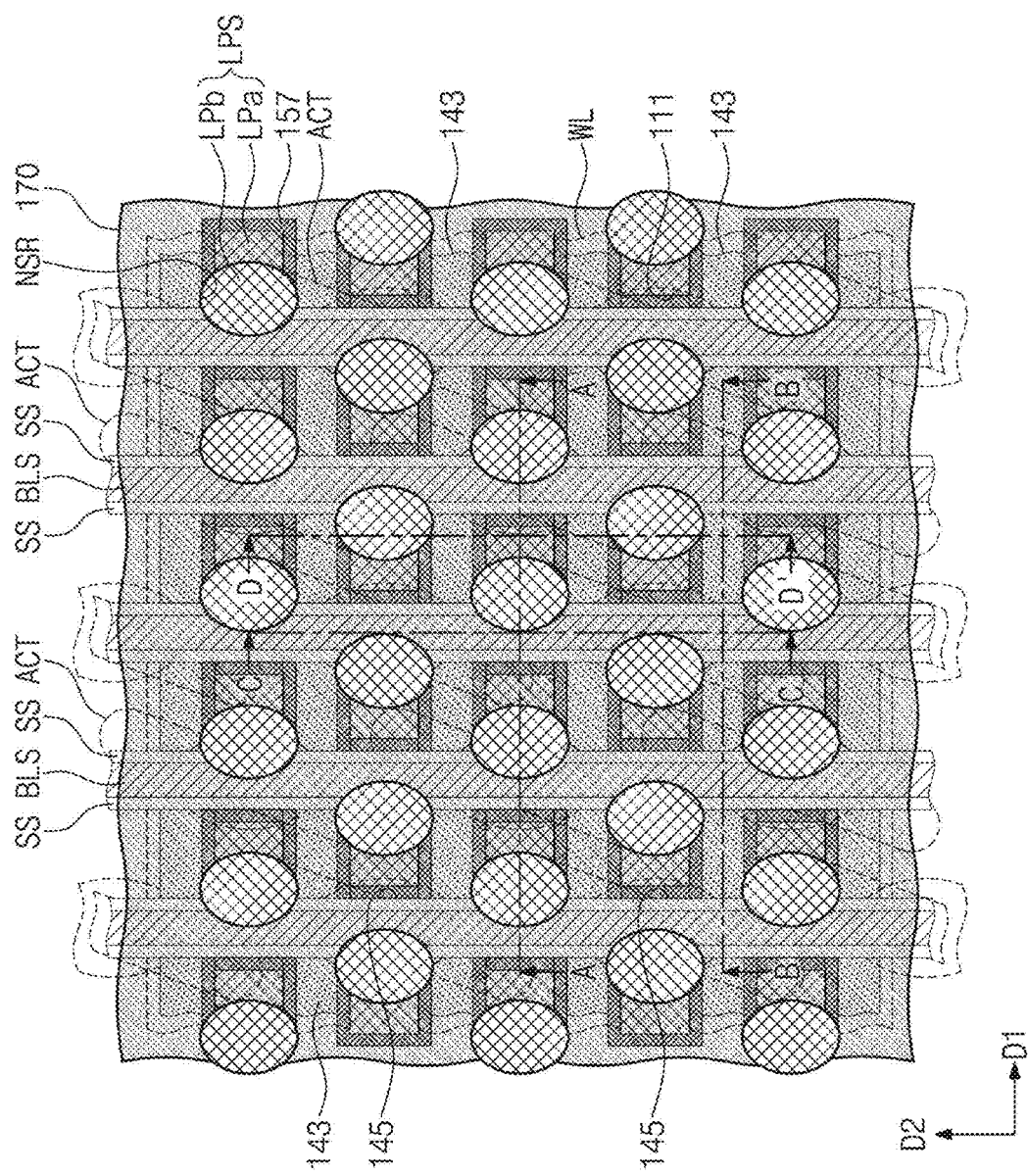
FIG. 1A illustrates a plan view showing a semiconductor memory device according to some example embodiments of inventive concepts.
Figure 1B:
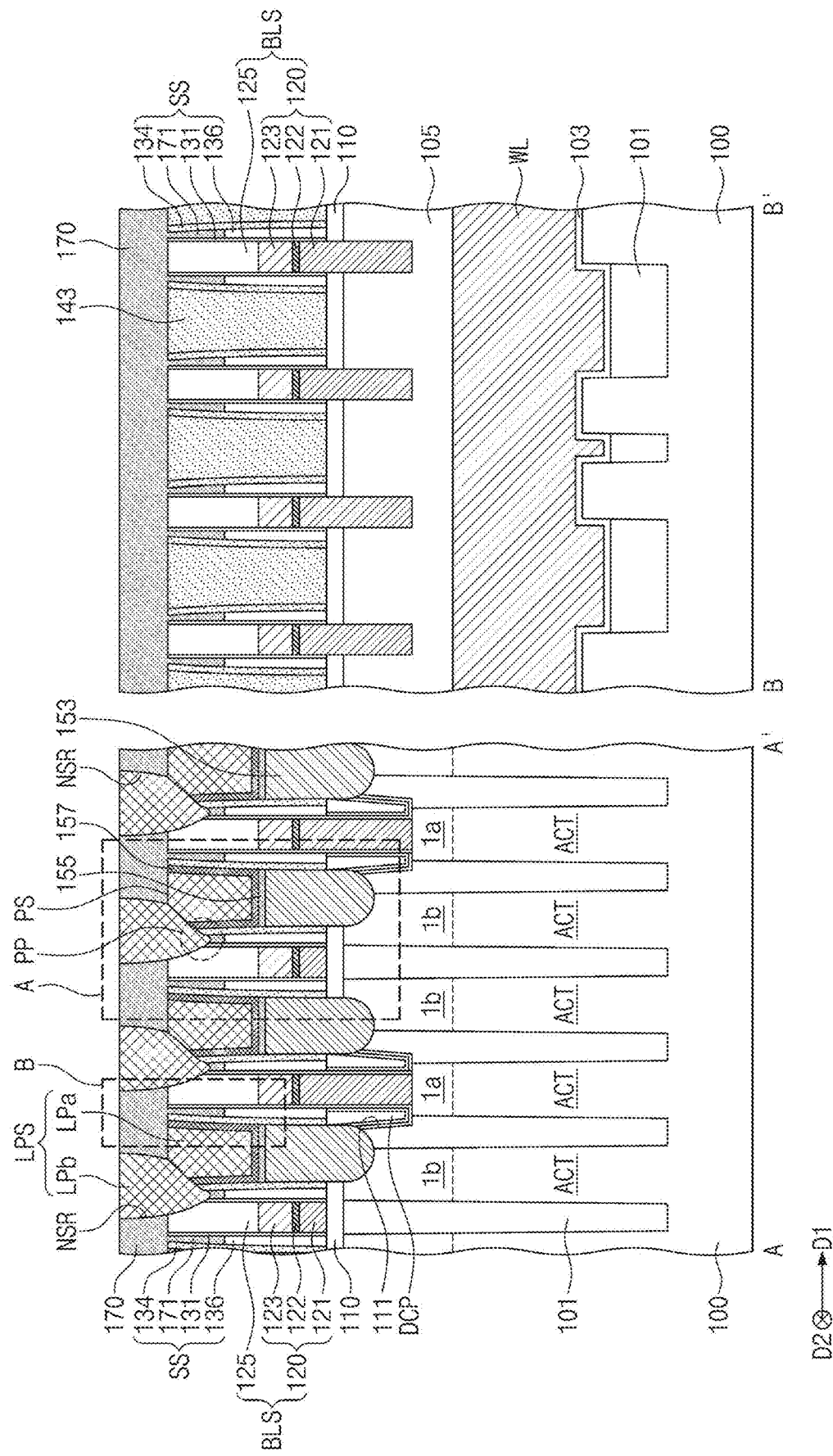
FIG. 1B illustrates a cross-sectional view taken along lines A-A' and B-B' of FIG. 1A.
Figure 1C:
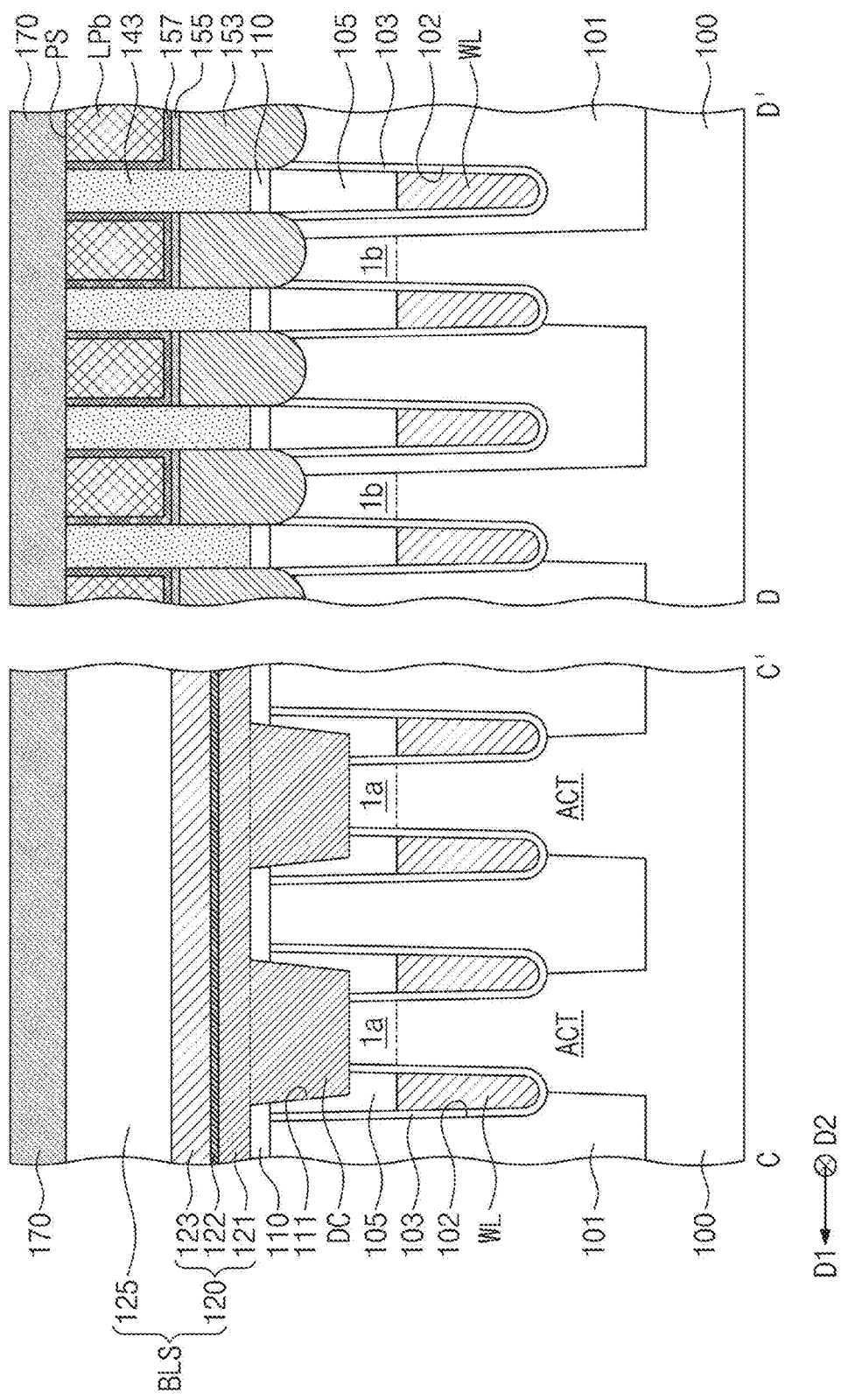
FIG. 1C illustrates a cross-sectional view taken along lines C-C' and D-D' of FIG. 1A.
Figure 2A:
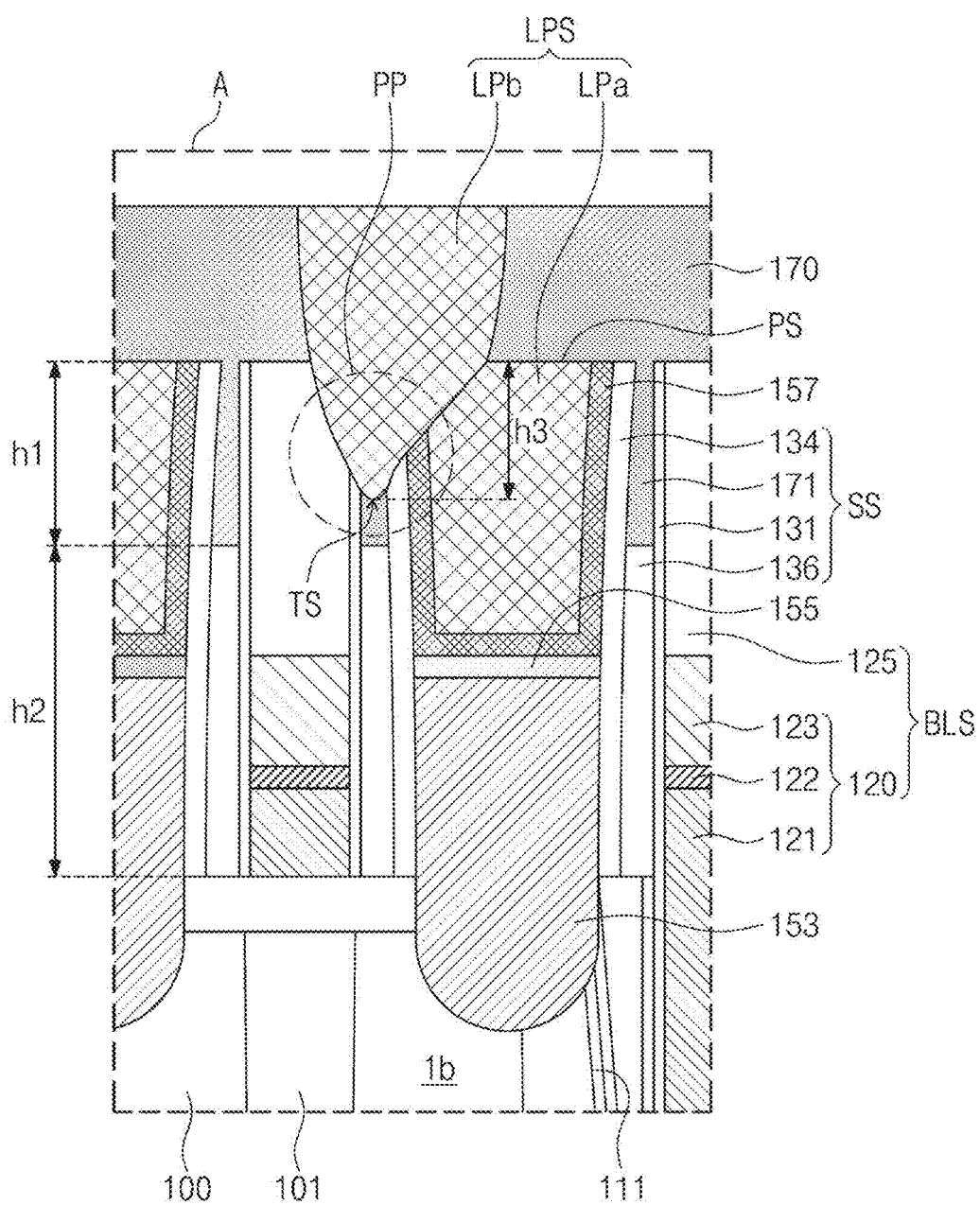
FIGS. 2A and 2B illustrate enlarged views showing section A of FIG. 1B.
Figure 2B:
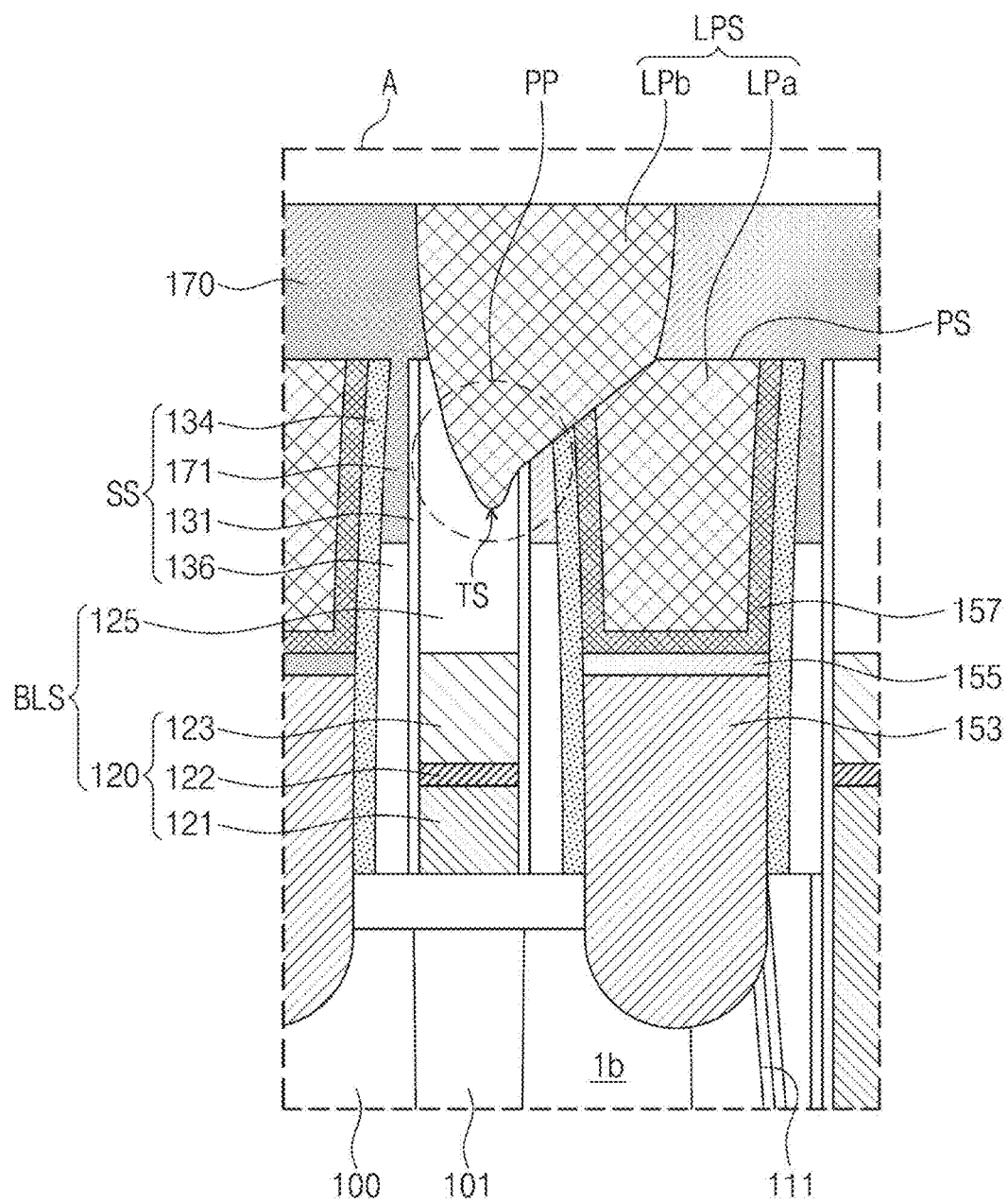
Figure 3A:
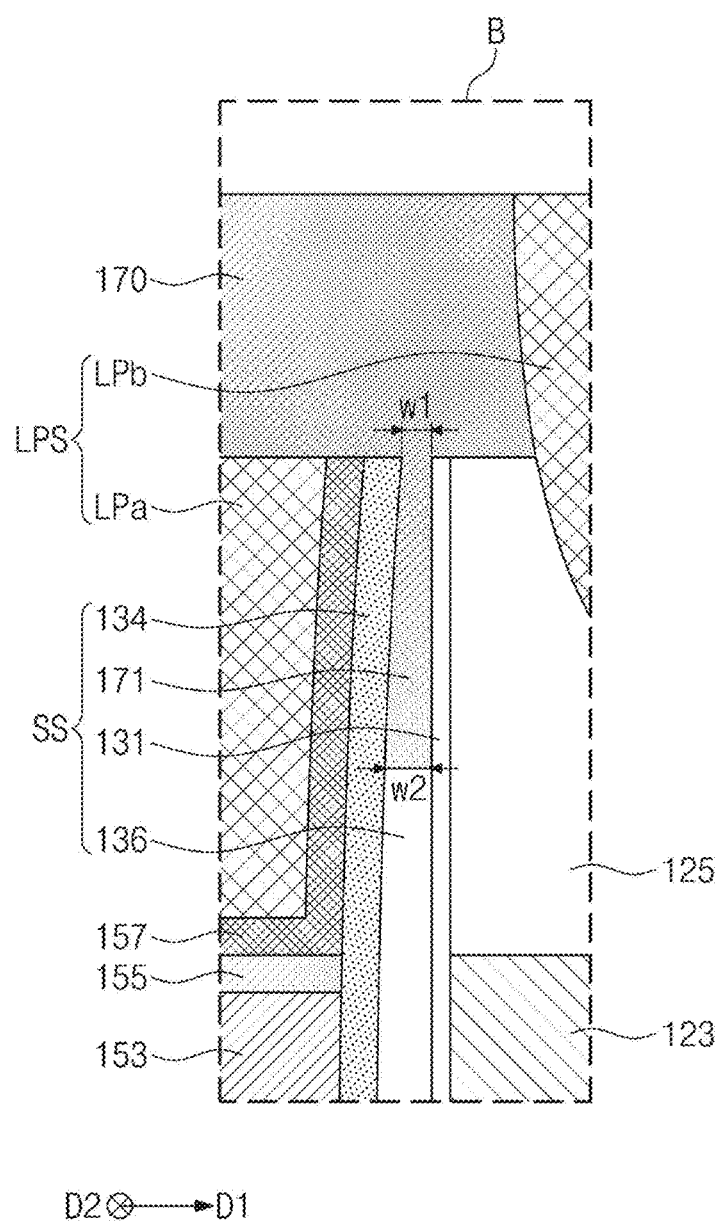
FIGS. 3A and 3B illustrate enlarged views showing section B of FIG. 1B.
Figure 3B:
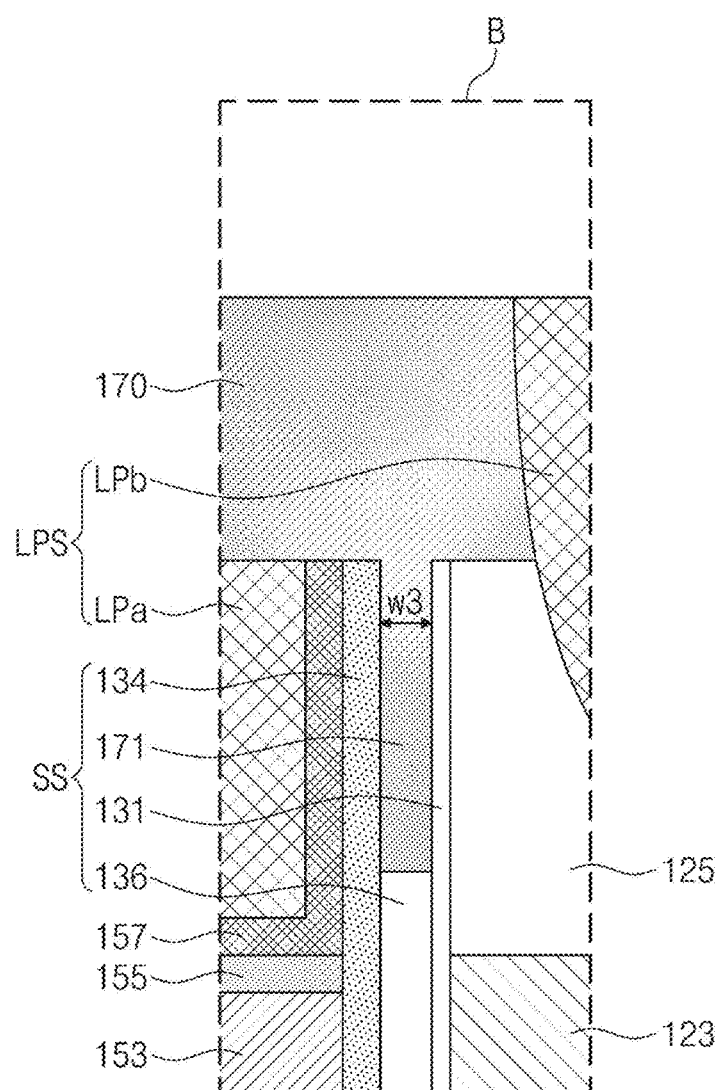

FIG. 1A illustrates a plan view showing a semiconductor memory device according to some example embodiments of inventive concepts. FIG. 1B illustrates a cross-sectional view taken along lines A-A' and B-B' of FIG. 1A. FIG. 1C illustrates a cross-sectional view taken along lines C-C' and D-D' of FIG. 1A. FIGS. 2A and 2B illustrate enlarged views showing section A of FIG. 1B. FIGS. 3A and 3B illustrate enlarged views showing section B of FIG. 1B. The semiconductor memory device may be or may include a volatile memory device such as dynamic random access (DRAM) device; however, inventive concepts are not limited thereto, and the semiconductor memory device may be or may include a non-volatile memory device.

Referring to FIGS. 1A, 1B, and 1C, a semiconductor substrate 100 may be provided therein with a device isolation layer 101 defining active regions ACT. The semiconductor substrate 100 may include one or more of a silicon substrate, a germanium substrate, and a silicon-germanium substrate. The semiconductor substrate 100 may include a silicon-on-insulator (SOI) substrate.

The active regions ACT may be two-dimensionally arranged along a first direction D1 and a second direction D2. Each of the active regions ACT may have, for example, a rectangular or bar shape. When viewed in plan, the active regions ACT may be arranged in a zigzag shape, and may have their major axes in a diagonal direction to the first and second directions D1 and D2. An angle of the diagonal direction with respect to the first direction D1 may be between about 55 degrees and about 80 degrees, for example, about 70 degrees; however, inventive concepts are not limited thereto.

Word lines WL may be disposed in the semiconductor substrate 100. When viewed in plan, the word lines WL may extend in the first direction D1 to run across the active regions ACT and the device isolation layer 101. The word lines WL may be arranged along the second direction D2. A gate dielectric layer 103 may be provided between one of the word lines WL and the semiconductor substrate 100.

For example, gate recessions 102 may be provided in the active regions ACT and the device isolation layer 101. The gate dielectric layer 103 may conformally cover an inner sidewall of the gate recession 102. The gate dielectric layer 103 may be formed with an in-situ steam generation (ISSG) process; however, inventive concepts are not limited thereto. The word lines WL may fill a lower portion of the gate recession 102 in which the gate dielectric layer 103 is provided. The word lines WL may have their top surfaces lower than that of the semiconductor substrate 100. The word lines WL may be formed with a physical vapor deposition (PVD) process and/or a chemical vapor deposition (CVD) process, such as a plasma-enhanced chemical vapor deposition (PECVD) process. The word lines WL may be provided on a top surface with a hardmask pattern 105 filling a remaining portion of the gate recession 102. The hardmask pattern 105 may have a top surface at substantially the same level as that of the top surface of the semiconductor substrate 100. The hardmask pattern 105 may include an insulating material, such as a nitride (Si3N4) insulating material and/or an oxide (SiO2) insulating material.

The active regions ACT may be provided therein with first and second impurity regions 1a and 1b spaced apart from each other. The first and second impurity regions 1a and 1b may have their depths from a top surface of the active region ACT. The first impurity region 1a may be disposed on an upper portion of the active region ACT between a pair of word lines WL. For example, when viewed in plan, the first impurity region 1a may occupy a central portion of the active region ACT. When viewed in plan, the second impurity regions 1b may be spaced apart from the first impurity region 1a and disposed on opposite end portions of the active region ACT. The first and second impurity regions 1a and 1b may be implanted with dopants whose conductive type is opposite to that of the semiconductor substrate 100. For example, if the conductivity type of the semiconductor substrate 100 is p-type, then the dopants implanted into the first and second impurity regions 1a and 1b may be n-type, such as phosphorous (P) and/or arsenic (As).

Bit line structures BLS may be provided on the semiconductor substrate 100. The bit line structures BLS may extend in the second direction D2, while running across the active regions ACT. The bit line structures BLS may intersect and be insulated from the word lines WL. The bit line structure BLS may include a bit line 120 and a bit line capping pattern 125 on the bit line 120. The bit line capping pattern 125 may include a nitride capping material; however, inventive concepts are not limited thereto.

The bit line 120 may include a doped or undoped polysilicon pattern 121, a silicide pattern 122, and a metal pattern 123 that are sequentially stacked. The bit line capping pattern 125 may be disposed on the metal pattern 123. A first interlayer dielectric layer 110 may be interposed between the polysilicon pattern 121 and the semiconductor substrate 100, and the polysilicon pattern 121 may have portions (referred to hereinafter as bit line contact patterns DC) in contact with the first impurity regions 1a. For example, the bit line 120 may be electrically connected through the bit line contact patterns DC to the first impurity regions 1a. The bit line contact pattern DC may have a bottom surface lower than the top surface of the semiconductor substrate 100 and higher than the top surfaces of the word lines WL. For example, the bit line contact pattern DC may be locally disposed in a depression 111 that is formed in the semiconductor substrate 100 and exposes the first impurity region 1a. When viewed in plan, the depression 111 may be shaped like an ellipse, and may have a width in a minor-axis direction greater than a width of the bit line structure BLS.

A bit line contact spacer DCP may fill a remaining portion of the depression 111 in which the bit line contact pattern DC is disposed. For example, the bit line contact spacer DCP may cover opposite sidewalls of the bit line contact pattern DC. Alternatively or additionally, the bit line contact spacer DCP may surround lateral surfaces of the bit line contact pattern DC in the depression 111. The bit line contact spacer DCP may include a dielectric material having an etch selectivity with respect to the first interlayer dielectric layer 110. For example, the bit line contact spacer DCP may include one or more of silicon oxide, silicon nitride, and silicon oxynitride, and may be formed of a multi-layered layer. The bit line contact spacer DCP may have a top surface at substantially the same level as that of a top surface of the first interlayer dielectric layer 110.

The first interlayer dielectric layer 110 may be provided thereon with dielectric patterns 143 spaced apart from each other in the second direction D2 between the bit line structures BLS. When viewed in plan, the dielectric patterns 143 may overlap the word lines WL and have their top surfaces at the same level as that of top surfaces of the bit line structures BLS. In certain example embodiments, the dielectric patterns 143 may include a dielectric material having an etch selectivity with respect to the first interlayer dielectric layer 110.

Storage node contacts 153 may be placed on sidewalls of the bit line structure BLS. Storage node contacts 153 may be disposed between the two adjacent bit line structures BLS.

The storage node contacts 153 may be arranged along the first and second direction D1 and D2. When viewed in plan, each of the storage node contacts 153 may be disposed between the word lines WL and between the bit line structures BLS. Each of the storage node contacts 153 may fill a space defined by the bit line structures BLS adjacent to each other in the first direction D1 and the dielectric patterns 143 adjacent to each other in the second direction D2. At least one of the storage node contacts 153 may include, for example, impurity-doped polysilicon.

The storage node contacts 153 may penetrate the first interlayer dielectric layer 110 and directly contact the second impurity regions 1b. For example, at least one of the storage node contacts 153 may have a bottom end lower than the top surface of the semiconductor substrate 100 and higher than the bottom surface of the bit line contact pattern DC. The bit line contact spacer DCP may insulate the storage node contacts 153 from the bit line contact pattern DC. The storage node contacts 153 may have a top surface lower than that of the metal pattern 123 of the bit line structure BLS.

A spacer structure SS may be interposed between the storage node contact 153 and the bit line structure BLS. The spacer structure SS may extend in the second direction D2 along the sidewall of the bit line structure BLS. The spacer structure SS may include at least one of a first spacer 131, a second spacer 134, an air spacer 136, and a spacer capping pattern 171. The first spacer 131 may be disposed on the sidewall of the bit line structure BLS. The second spacer 134 may be disposed between the first spacer 131 and the storage node contact 153. The air spacer 136 may be defined between the first spacer 131 and the second spacer 134. The spacer capping pattern 171 may be disposed between the first spacer 131 and the second spacer 134, defining a top end of the air spacer 136. For example, the air spacer 136 may be defined between the first spacer 131 and second spacer 134 and below the spacer capping pattern 171. The spacer capping pattern 171, the first spacer 131, and the second spacer 134 may have their top ends at substantially the same level. The air spacer 136 may have a top end substantially below the top ends of the spacer capping pattern 171, the first spacer 131, and the second spacer 134.

A second interlayer dielectric layer 170 may be disposed on the bit line structures BLS and the spacer structures SS. The second interlayer dielectric layer 170 may be placed, e.g. directly placed, on the top surfaces of the bit line structures BLS and top ends of the spacer structures SS. The second interlayer dielectric layer 170 may include, e.g. formed of, a material having excellent gap-fill characteristics. The second interlayer dielectric layer 170 may include, for example, a silicon nitride layer. The second interlayer dielectric layer 170 and the underlying spacer capping pattern 171 may be connected into a single body. For example, the spacer capping pattern 171 may extend from a bottom surface of the second interlayer dielectric layer 170 toward a space between the first spacer 131 and the second spacer 134. For example, the spacer capping pattern 171 and the second interlayer dielectric layer 170 may be integrated together.

A landing pad structure LPS may penetrate the second interlayer dielectric layer 170 and may have electrical connection with the storage node contact 153. The landing pad structure LPS may include a protrusion PP that protrudes toward the semiconductor substrate 100. The protrusion PP may have a bottom end (see TS of FIG. 2A) at a lower level than that of the top end of the spacer structure SS. The bottom end TS of the protrusion PP may vertically overlap the spacer structure SS. For example, the bottom end TS of the protrusion PP may be positioned on and in direct contact with the spacer capping pattern 171.

The landing pad structure LPS may include a lower landing pad LPa and an upper landing pad LPb. The lower landing pad LPa may be disposed between a pair of bit line structures BLS and on the storage node contact 153. The lower landing pad LPa may have a top surface at substantially the same level as that of the top surface of the bit line structure BLS and that of the top end of the spacer structure SS.

The upper landing pad LPb may penetrate the second interlayer dielectric layer 170 and have connection with the lower landing pad LPa. For example, the upper landing pad LPb may be placed in an isolation trench NSR exposing a portion of the lower landing pad LPa. The isolation trench NSR may have a bottom surface at a lower level than that of the top surface of the lower landing pad LPa. When viewed in plan, a plurality of isolation trenches NSR may be arranged in a zigzag shape and/or in a honeycomb shape. The protrusion PP of the landing pad structure LPS may be a portion of the upper landing pad LPb. The upper landing pad LPb may have a top surface at a higher level than that of the top surface of the bit line structure BLS. The upper landing pad LPb may vertically overlap the bit line structure BLS and the spacer structure SS. In certain example embodiments, a data storage pattern, such as a capacitor, may be coupled to, e.g. electrically connected to, the upper landing pad LPb.

A contact silicide pattern 155 may be disposed between the storage node contact 153 and the landing pad structure LPS. The contact silicide pattern 155 may cover the top surface of the storage node contact 153. The contact silicide pattern 155 may include at least one of, for example, titanium silicide, cobalt silicide, nickel silicide, tungsten silicide, platinum silicide, or molybdenum silicide. In certain example embodiments, the contact silicide pattern 155 may not be provided.

A barrier pattern 157 may be disposed between the lower landing pad LPa and the spacer structure SS and between the lower landing pad LPa and the storage node contact 153. The barrier pattern 157 may cover lateral and bottom surfaces of the lower landing pad LPa. The barrier pattern 157 may expose the top surface of the lower landing pad LPa. The barrier pattern 157 may have a top end at a substantially the same level as that of the top surface of the lower landing pad LPa. The barrier pattern 157 may include a metal nitride layer. The barrier pattern 157 may include, for example, at least one of titanium nitride, tantalum nitride, or tungsten nitride.

Referring to FIGS. 2A and 2B, the lower landing pad LPa may have a flat region PS substantially parallel to the top surface of the semiconductor substrate 100. The flat region PS may correspond to the top surface of the lower landing pad LPa and lie at the same level as that of the top surface of the bit line structure BLS. The flat region PS may be located at the same level as that of the top end of the spacer structure SS. Therefore, the flat region PS of the lower landing pad LPa may be coplanar with the top surface of the bit line structure BLS and the top end of the spacer structure SS.

The upper landing pad LPb may include the protrusion PP, which is discussed above, protruding toward the semiconductor substrate 100. The bottom end TS of the protrusion PP may be located at a lower level than that of the flat region PS of the lower landing pad LPa. The bottom end TS of the protrusion PP may be located at a higher level than that of the bottom surface of the lower landing pad LPa. The bottom end TS of the protrusion PP may be spaced apart from the lateral surface of the lower landing pad LPa.

In certain example embodiments, as shown in FIG. 2A, the bottom end TS of the protrusion PP may be positioned on the spacer capping pattern 171. The spacer capping pattern 171 may have a bottom end at a lower level than that of the bottom end TS of the protrusion PP such that the protrusion PP may not extend into the air spacer 136. For example, the spacer capping pattern 171 may have a height h1 greater than a vertical distance h3 between the bottom end TS of the protrusion PP and the flat region PS. Additionally or alternatively, as shown in FIG. 2B, the bottom end TS of the protrusion PP may be positioned on the bit line 120. For example, the bottom end TS of the protrusion PP may be disposed in the bit line capping pattern 125 of the bit line structure BLS.

The bottom end of the spacer capping pattern 171, and/or the top end of the air spacer 136, may be located at a higher level than that of the top surface of the metal pattern 123. The air spacer 136 may have a height h2 greater than the height h1 of the spacer capping pattern 171 (see FIG. 2A). The air spacer 136 may have a dielectric constant less than that of the spacer capping pattern 171; for example the air spacer 136 may include air such as clean, dry air, and have a dielectric constant of about 1. Thus a reduced parasitic capacitance may be provided between the bit line 120 and the storage node contact 153.

Referring to FIG. 3A, the spacer capping pattern 171 may have a width as measured in the first direction D1 that increases with decreasing distance from the semiconductor substrate 100. For example, the spacer capping pattern 171 may have a width w2 in the first direction D1 at the bottom end thereof and a width w1, which is less than the width w2, in the first direction D1 at the top end thereof. The spacer capping pattern may have the width w1 at the bottom of the level of upper landing pad LPb and the width w2 at the top of the air spacer 136.

Alternatively, referring to FIG. 3B, the spacer capping pattern 171 may have a width w3 in the first direction D1, which width w3 may be uniform regardless of distance from the semiconductor substrate 100.

FIGS. 4A to 12A illustrate plan views showing a method of fabricating a semiconductor memory device according to some example embodiments of inventive concepts. FIGS. 4B to 12B illustrate cross-sectional views taken along lines A-A' and B-B' of FIGS. 4A to 12A. FIGS. 4C to 12C illustrates cross-sectional views taken along lines C-C' and D-D' of FIGS. 4A to 12A.

Figure 4A:
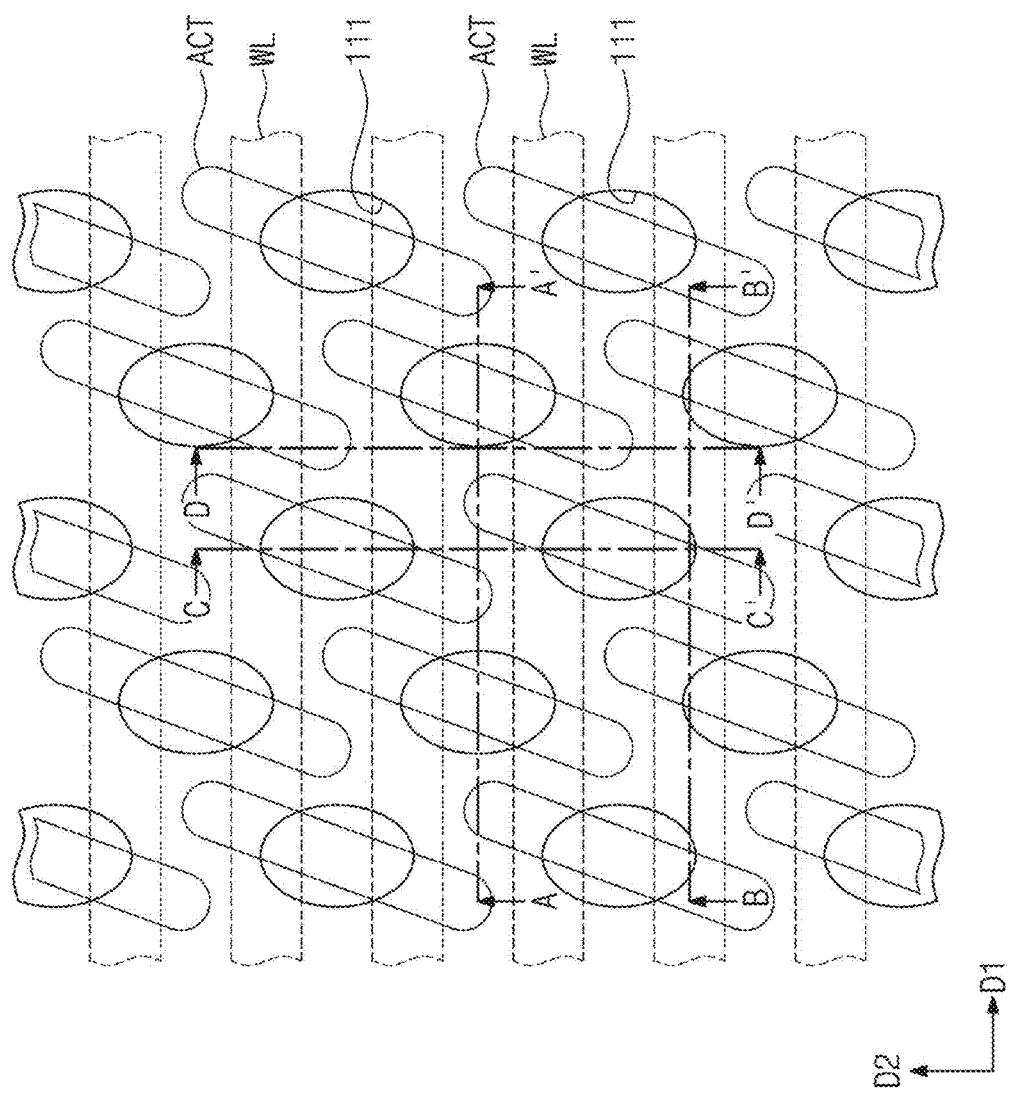
Figure 4B:
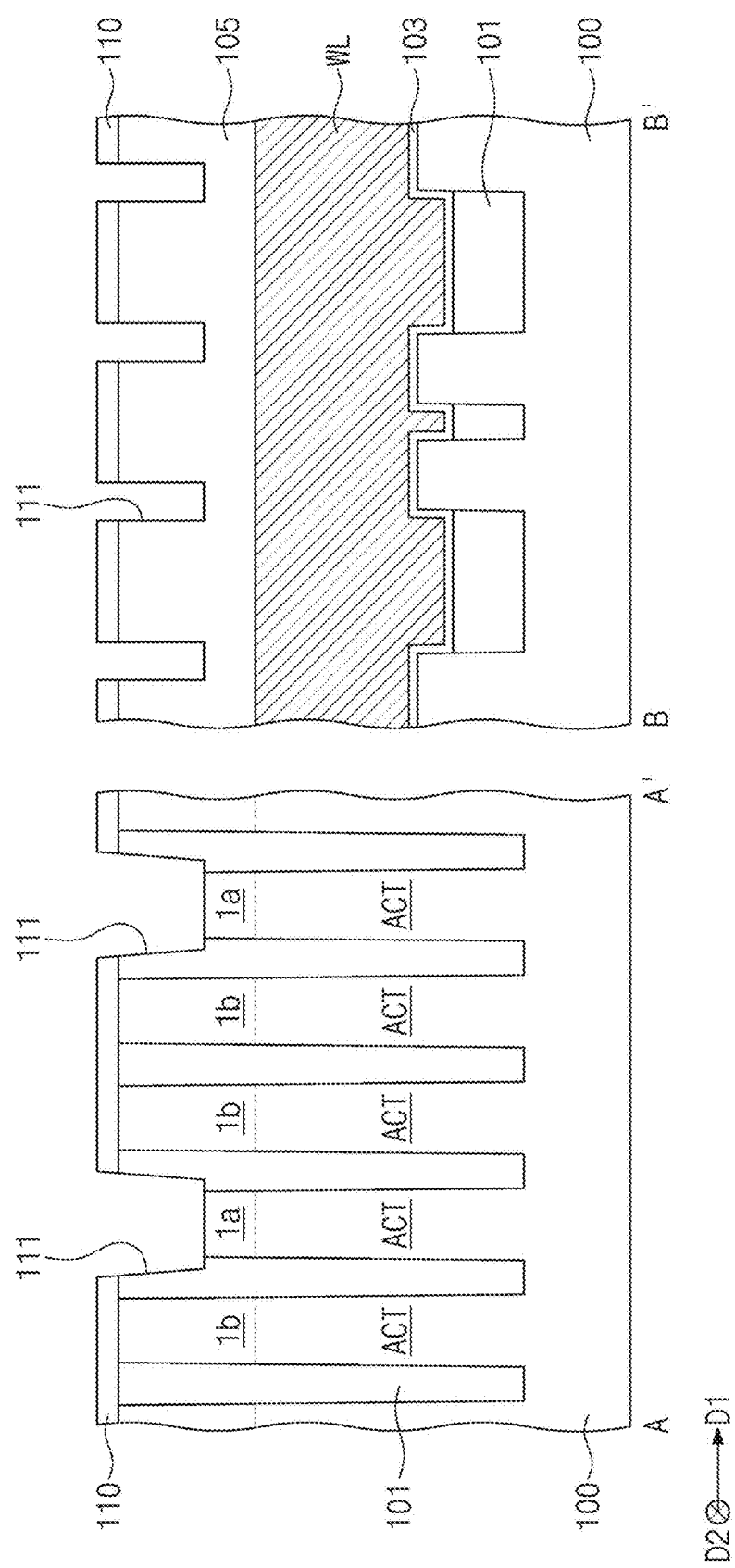
Figure 4C:
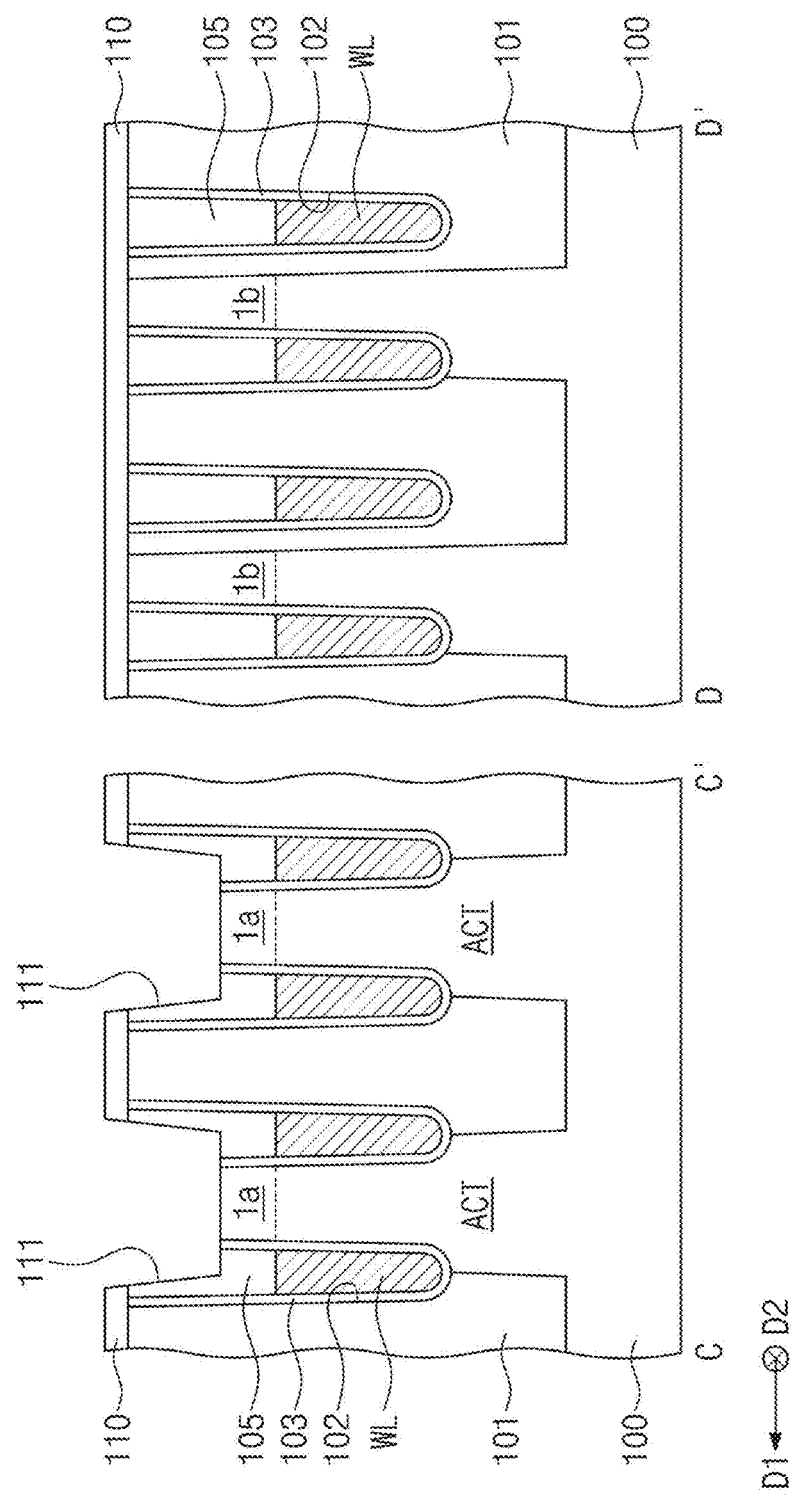

Referring to FIGS. 4A, 4B, and 4C, a device isolation layer 101 may be formed in a semiconductor substrate 100, defining active regions ACT. The device isolation layer 101 may be formed by forming a substrate trench (not shown) in the semiconductor substrate 100 and then filling the substrate trench with a dielectric material. The device isolation layer 101 may be formed with a shallow trench isolation (STI) process. The active regions ACT, which are divided by the substrate trench, may be two-dimensionally arranged along a first direction D1 and a second direction D2. When viewed in plan, the active regions ACT may be arrayed in a zigzag shape.

The semiconductor substrate 100 may be provided thereon with a plurality of word lines WL extending in the first direction D1. For example, the active regions ACT and the device isolation layer 101 may be patterned to form gate recessions 102 extending in the first direction D1. Gate dielectric layers 103 may be formed in the gate recessions 102. The gate dielectric layers 103 may be formed with an in-situ steam generation (ISSG) process; however, inventive concepts are not limited thereto. After forming the gate dielectric layers 103, then the word lines WL may be formed in the gate recessions 102. The gate recessions 102 may have their bottom surfaces higher than that of the device isolation layer 101. The word lines WL may have their top surfaces lower than that of the device isolation layer 101. Hardmask patterns 105 may be formed in the gate recessions 102 in which the word lines WL are disposed.

After the word lines WL are formed, first and second impurity regions 1a and 1b may be formed in the active regions ACT on opposite sides of each of the word lines WL. The first and second impurity regions 1a and 1b may be formed by performing an ion implantation process and may have a conductive type opposite to that of the active region ACT. The first and second impurity regions 1a and 1b may be formed at the same time; however, inventive concepts are not limited thereto.

A first interlayer dielectric layer 110 may be formed on an entire surface of the semiconductor substrate 100. The first interlayer dielectric layer 110 may include a single dielectric layer or a plurality of dielectric layers. The first interlayer dielectric layer 110 may include, for example, one or more of a silicon oxide layer, a silicon nitride layer, and a silicon oxynitride layer.

In certain example embodiments, the semiconductor substrate 100 and the first interlayer dielectric layer 110 may be patterned to form depressions 111 exposing corresponding first impurity regions 1a. For example, each of the depressions 111 may have an elliptical shape having a major axis in the second direction D2. When viewed in plan, the depressions 111 may be arranged in a zigzag shape and/or in a honeycomb shape.

In certain example embodiments, when an anisotropic etching process is performed to form the depressions 111, the anisotropic etching process may partially etch the first impurity regions 1a, the device isolation layer 101 adjacent to the first impurity regions 1a, and the hardmask patterns 105. The depression 111 may have a bottom surface higher than that of the first impurity regions 1a and partially expose the device isolation layer 101 and the hardmask patterns 105.

Figure 5B:
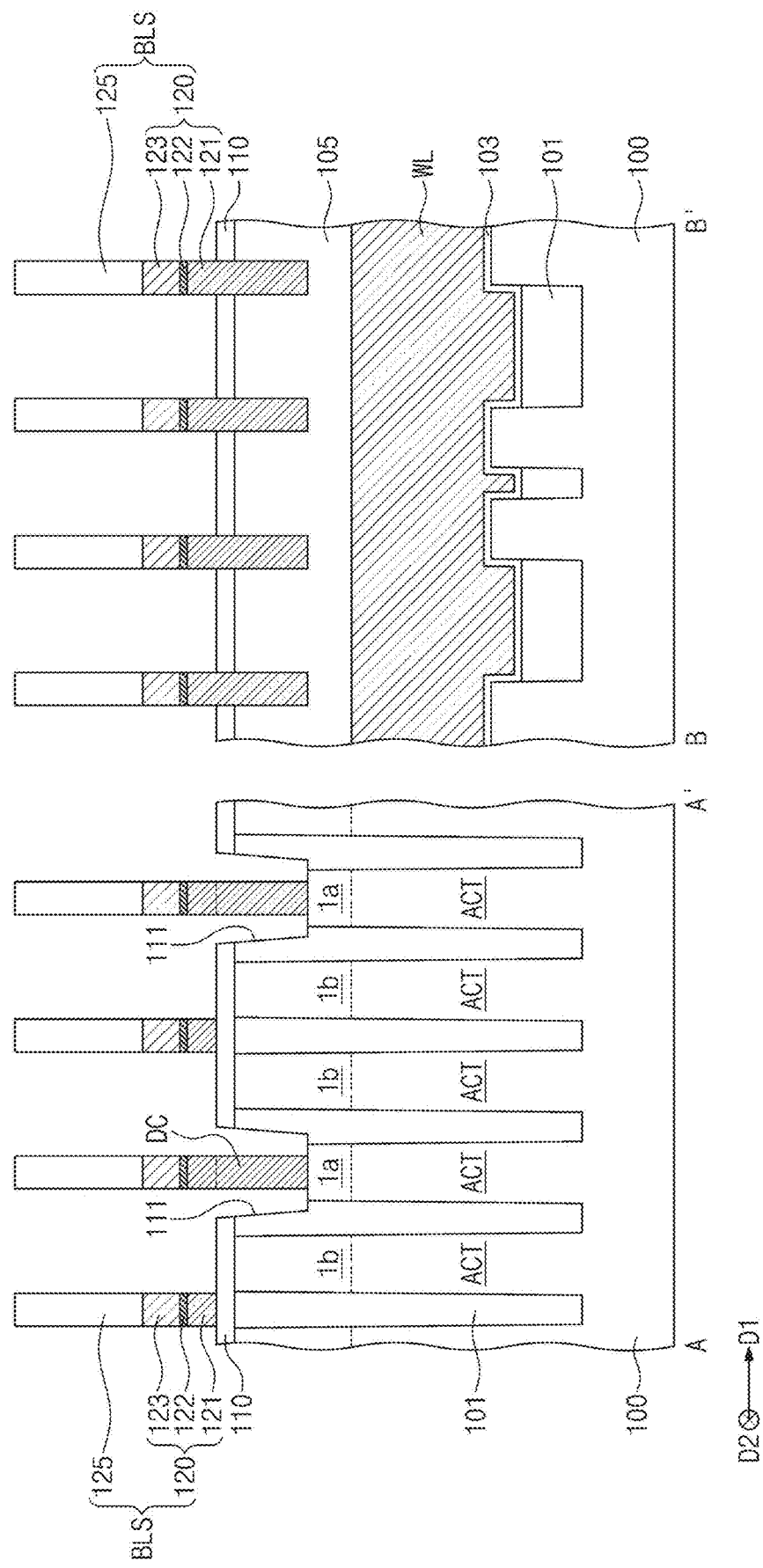
Figure 5C:
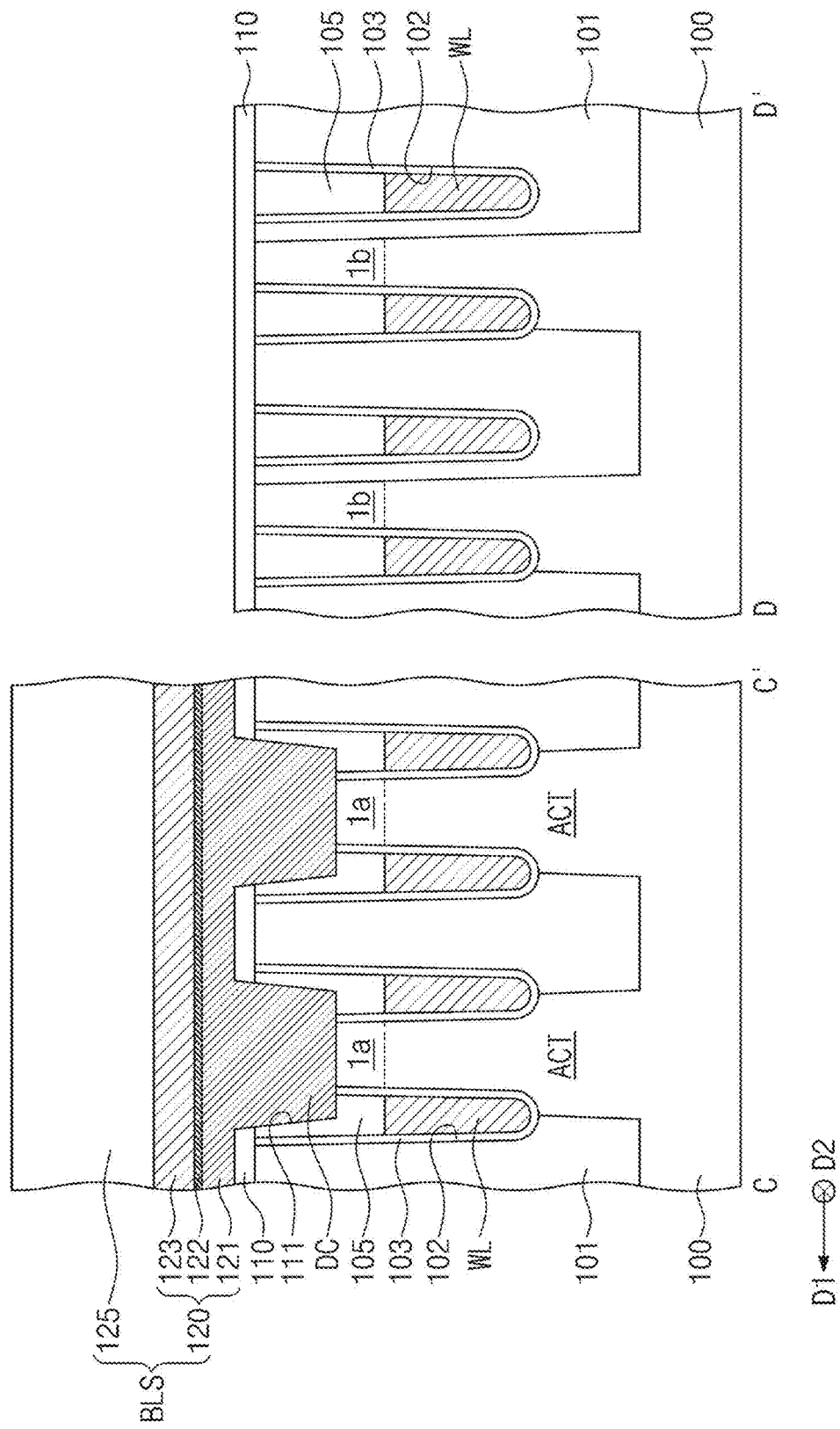

Referring to FIGS. 5A, 5B, and 5C, bit line structures BLS extending in the second direction D2 may be formed on the first interlayer dielectric layer 110 having the depressions 111.

The formation of the bit line structures BLS may include forming on the first interlayer dielectric layer 110 a first conductive layer filling the depressions 111, forming a second conductive layer on the first conductive layer, forming a hardmask layer on the second conductive layer, forming a bit line mask pattern on the hardmask layer, and using the bit line mask pattern as an etching mask to sequentially etch the hardmask layer, the second conductive layer, and the first conductive layer. The first conductive layer may be formed of an impurity-doped semiconductor layer (e.g., a doped polysilicon layer), and the second conductive layer may be formed of a metal layer (e.g., at least one of a tungsten layer, an aluminum layer, a titanium layer, or a tantalum layer). A metal silicide layer may be formed between the first and second conductive layers.

Because the bit line structures BLS are formed as discussed above, each of the bit line structures BLS may include a polysilicon pattern 121, a silicide pattern 122, a metal pattern 123, and a bit line capping pattern 125 that are sequentially stacked. A portion of the polysilicon pattern 121 may be locally formed in the depression 111, and thus may constitute, e.g. be included in, a bit line contact pattern DC in direct contact with the first impurity region 1a. The polysilicon pattern 121 may have a sidewall spaced apart from a sidewall of the depression 111.

Figure 6B:
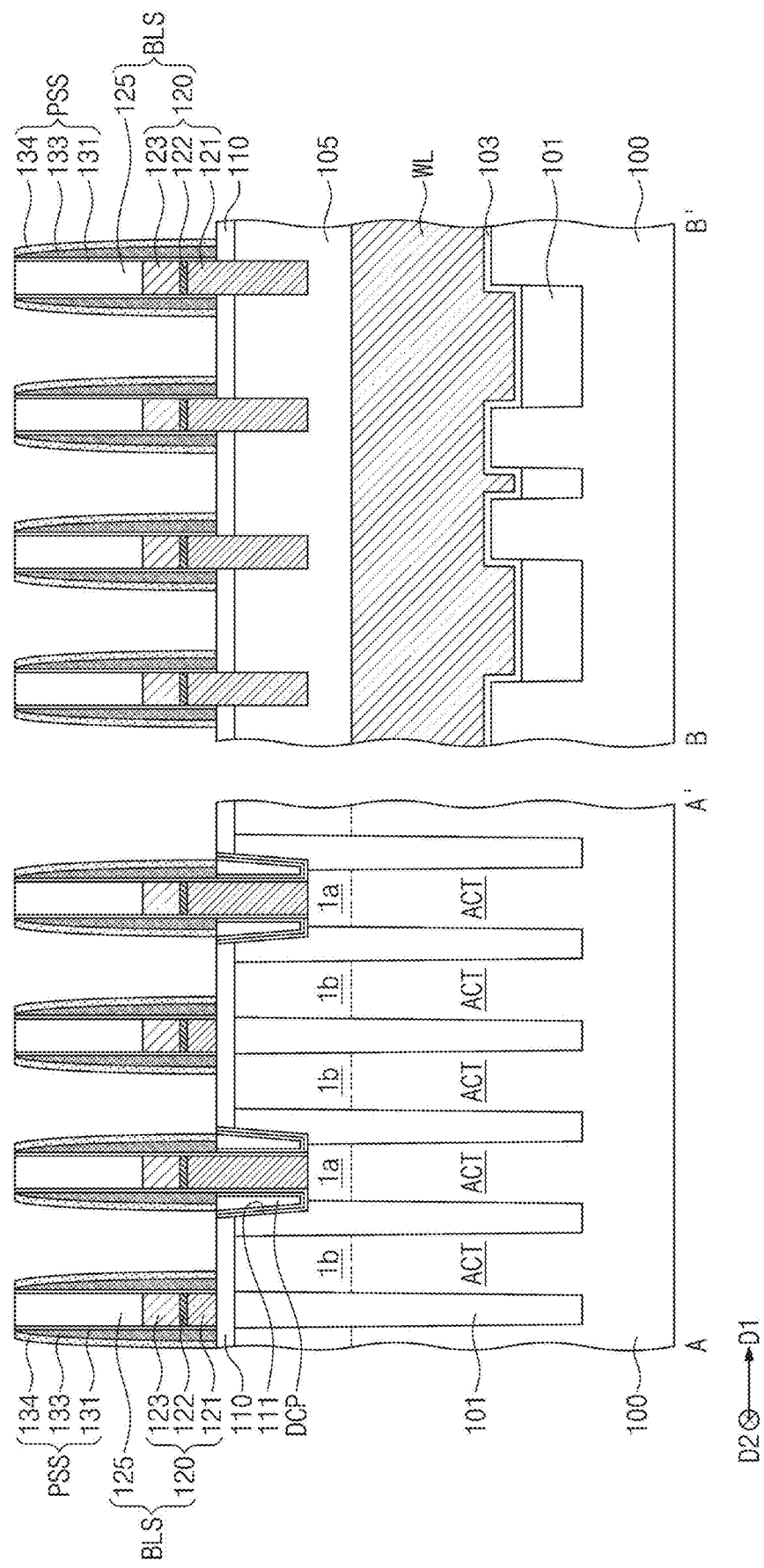
Figure 6C:
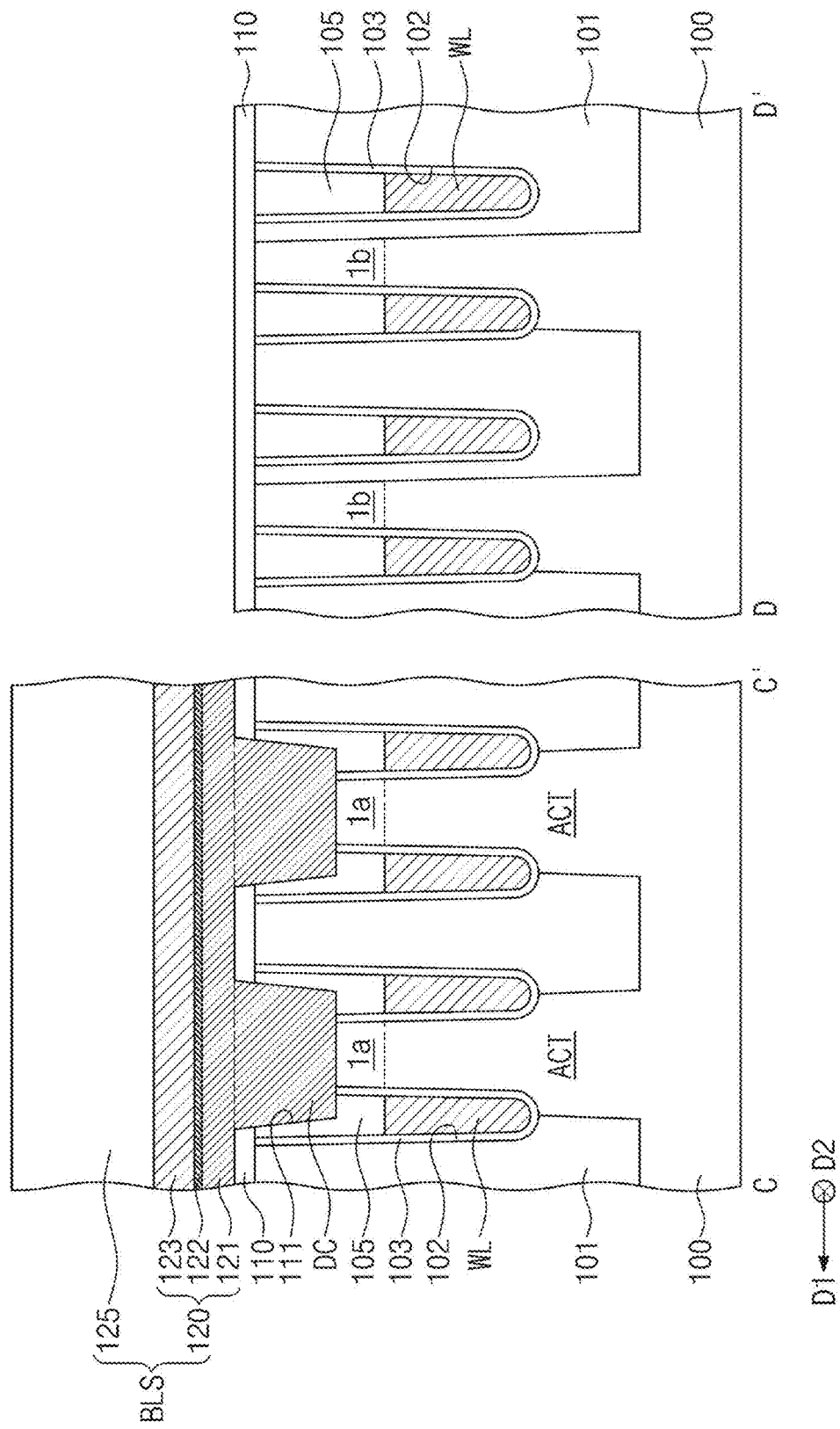

Referring to FIGS. 6A, 6B, and 6C, a first spacer 131, a sacrificial spacer 133, and a second spacer 134 may be sequentially formed to provide a preliminary spacer structure PSS on a sidewall of the bit line structure BLS. The first spacer 131, the sacrificial spacer 133, and the second spacer 134 may sequentially cover the sidewall of the bit line structure BLS.

For example, the formation of the first spacer 131 may include depositing a spacer layer filling the depressions 111 and conformally covering the bit line structures BLS, and anisotropically etching the spacer layer. The spacer layer may include a first nitride layer, an oxide layer, and a second nitride layer that are sequentially stacked. When the spacer layer is anisotropically etched, the oxide layer may serve as an etch stop layer, and the oxide layer and the second nitride layer may locally remain in the depression 111 to form a bit line contact spacer DCP. The first spacer 131 may include a lower segment filling the depression 111 and a sidewall segment covering the sidewall of the bit line structure BLS. In certain example embodiments, the first spacer 131 may extend in the second direction D2 along the sidewall of the bit line structure BLS, and may fill the depression 111.

After the first spacer 131 is formed, a sacrificial layer may be formed to conformally cover the entire surface of the semiconductor substrate 100, and then anisotropically etched to form the sacrificial spacer 133 on the sidewall of the bit line structure BLS. The sacrificial spacer 133 may be formed of a dielectric material, such as a silicon oxide layer, having an etch selectivity with respect to the first spacer 131. On the first spacer 131, the sacrificial spacer 133 may extend in the second direction D2 along the sidewall of the bit line structure BLS.

After the sacrificial spacer 133 is formed, the second spacer 134 may be formed to conformally cover the bit line structure BLS and the sacrificial spacer 133. The second spacer 134 may be formed of a dielectric material having an etch selectivity with respect to the sacrificial spacer 133 and the first interlayer dielectric layer 110. The second spacer 134 may be formed of, for example, a silicon nitride layer and/or a silicon oxynitride layer.

Figure 7B:
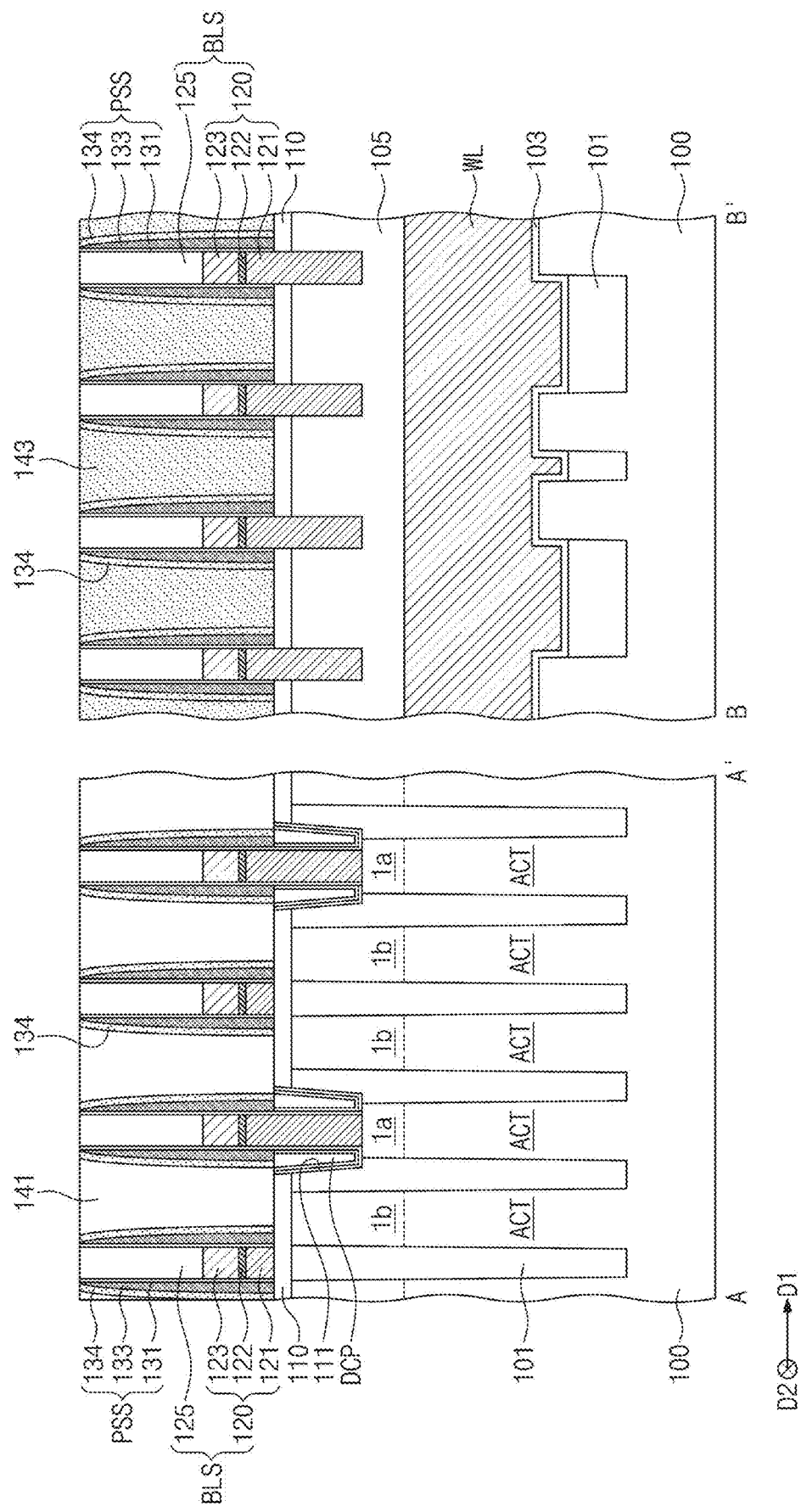
Figure 7C:
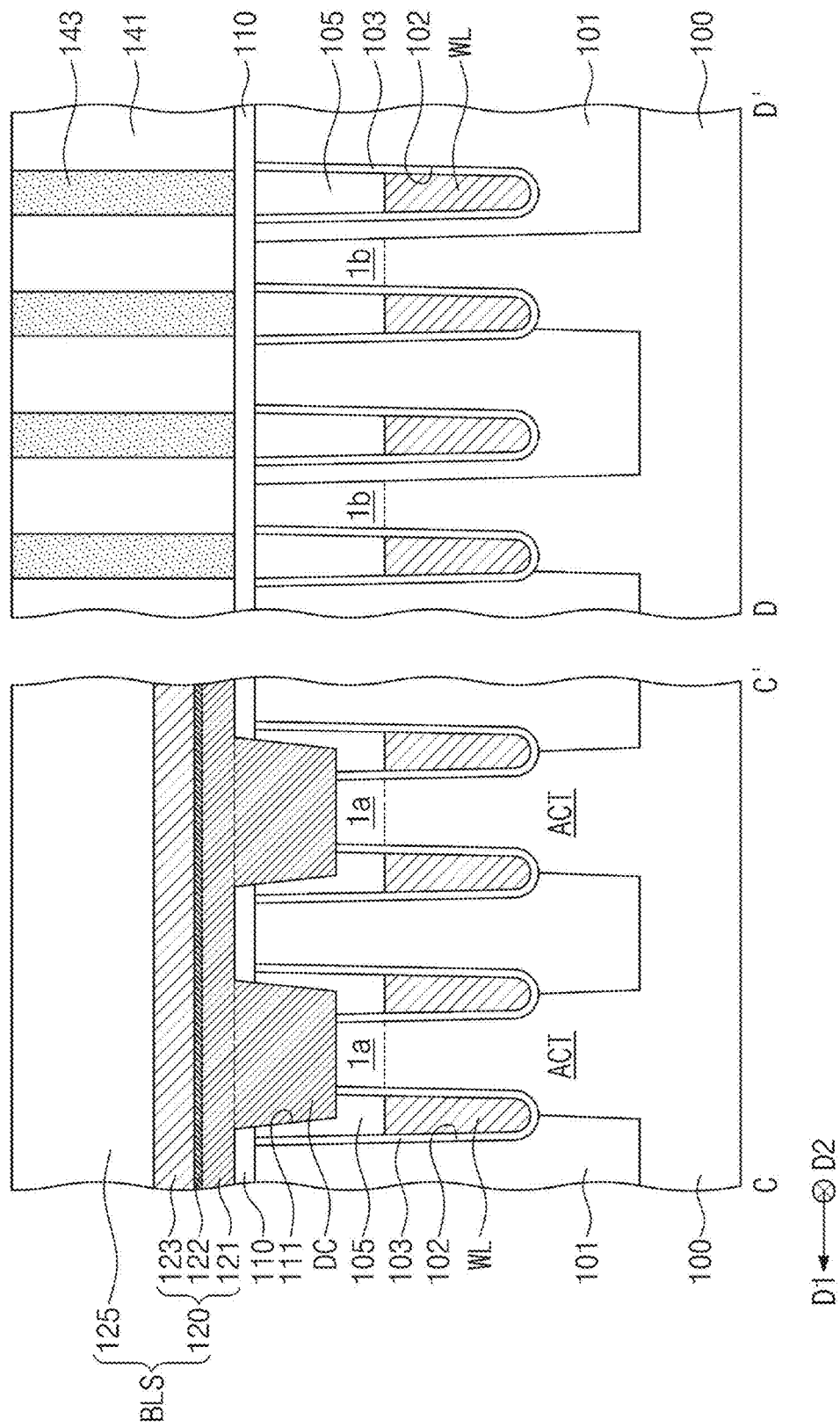

Referring to FIGS. 7A, 7B, and 7C, sacrificial patterns 141 and dielectric patterns 143 may be formed to be alternately arranged between the bit line structures BLS, and may extend along the second direction D2. In certain example embodiments, the dielectric patterns 143 may be formed on the word lines WL, and the sacrificial patterns 141 may be formed on the second impurity regions 1b.

For example, the formation of the sacrificial patterns 141 and the dielectric patterns 143 may include forming on the second spacer 134 a sacrificial layer filling spaces between the bit line structures BLS, forming on the sacrificial layer a plurality of mask patterns (not shown) extending in the first direction D1 parallel to the word lines WL, using the bit line structures BLS and the mask patterns as an etching mask to anisotropically etch the sacrificial layer to form the sacrificial patterns 141 exposing upper portions of the word lines WL, forming a dielectric layer filling spaces between the sacrificial patterns 141 and between the bit line structures BLS, and planarizing the dielectric layer to expose top surfaces of the mask patterns.

When viewed in plan, the sacrificial patterns 141 may be spaced apart from each other in the second direction D2 and disposed between the word lines WL. The sacrificial patterns 141 may be formed of a material having an etch selectivity with respect to the second spacer 134. For example, the sacrificial patterns 141 may be formed of a spin-on-hardmask (SOH) material, such as SOH silicon oxide. Top surfaces of the bit line structures BLS between the mask patterns may also be etched during the formation of the sacrificial patterns 141.

The dielectric patterns 143 may fill hollow spaces defined by the sacrificial patterns 141 and the bit line structures BLS, and when viewed in plan, may overlap the word lines WL. The dielectric patterns 143 may be formed of a dielectric material having an etch selectivity with respect to the sacrificial patterns 141, which dielectric material may include one or more of a silicon oxide layer, a silicon nitride layer, and a silicon oxynitride layer.

Figure 8B:
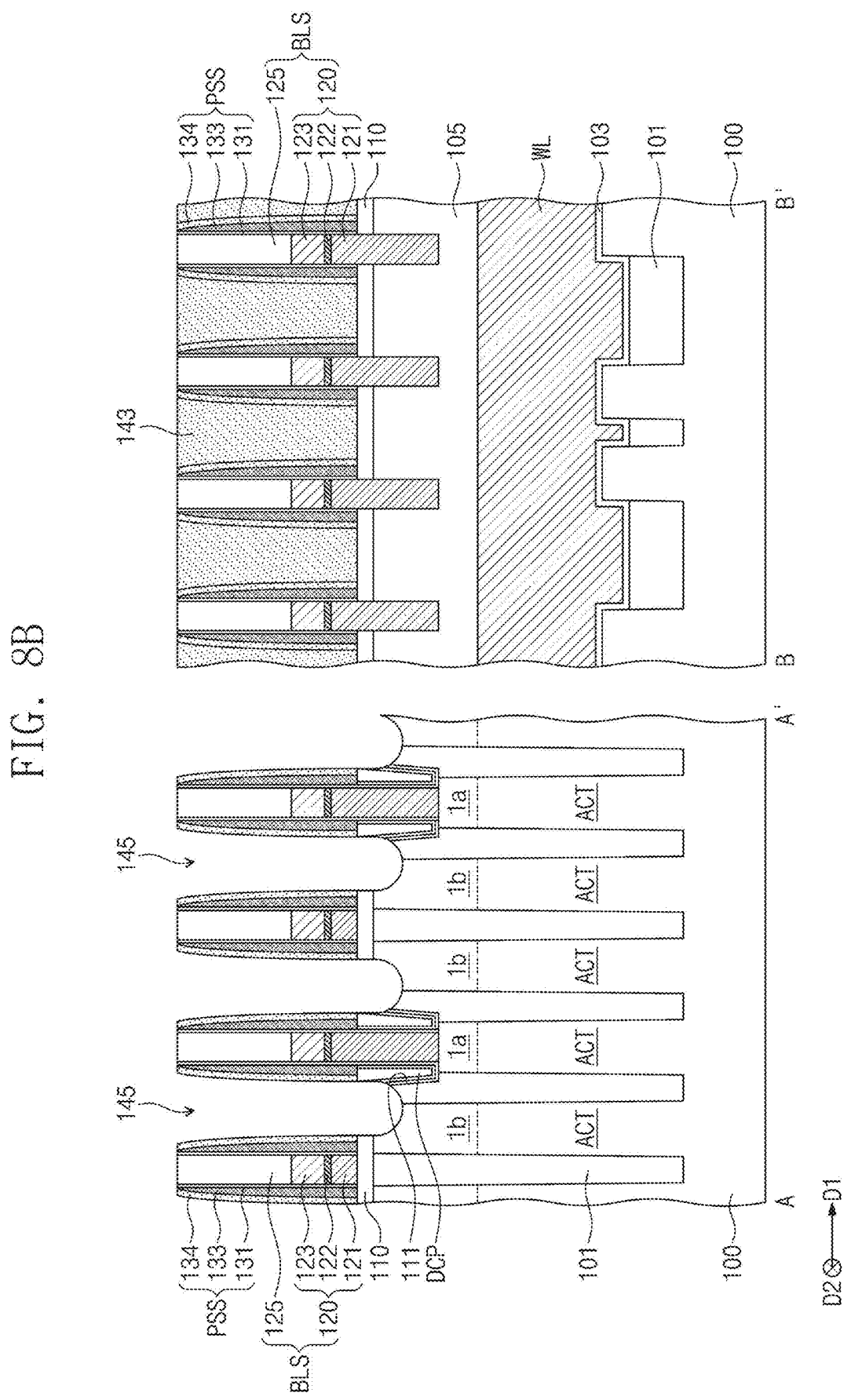
Figure 8C:
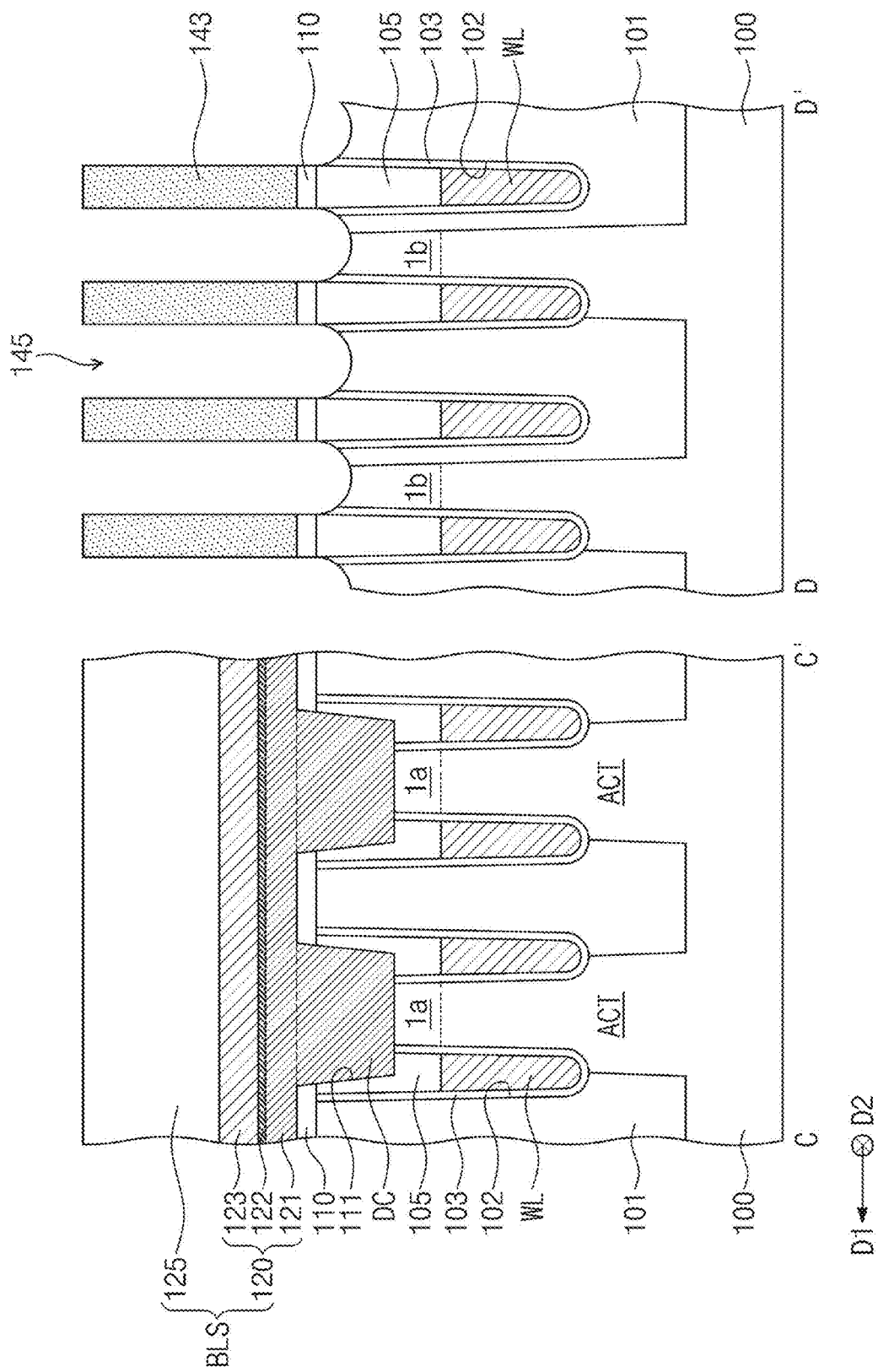

Referring to FIGS. 8A, 8B, and 8C, after the dielectric patterns 143 are formed, the sacrificial patterns 141 may be removed using an etch recipe having an etch selectivity with respect to the dielectric patterns 143 and the second spacer 134. Accordingly, the dielectric patterns 143 may be exposed on their sidewalls, and the second spacer 134 may be partially exposed. Contact regions may be defined between the sidewalls of the dielectric patterns 143 facing in the second direction D2 and between the second spacers 134 facing in the first direction D1.

The dielectric patterns 143 and the bit line structures BLS may be used as an etching mask to anisotropically etch portions of the first interlayer dielectric layer 110 and of the semiconductor substrate 100, portions of which are exposed to the contact regions, and accordingly contact holes 145 may be formed exposing the second impurity regions 1b.

The semiconductor substrate 100 and the device isolation layer 101 may be partially etched when the contact holes 145 are formed. The contact holes 145 may have their bottom surfaces below a top surface of the semiconductor substrate 100, and may expose portions of the bit line contact spacers DCP filing the depressions 111.

Figure 9B:
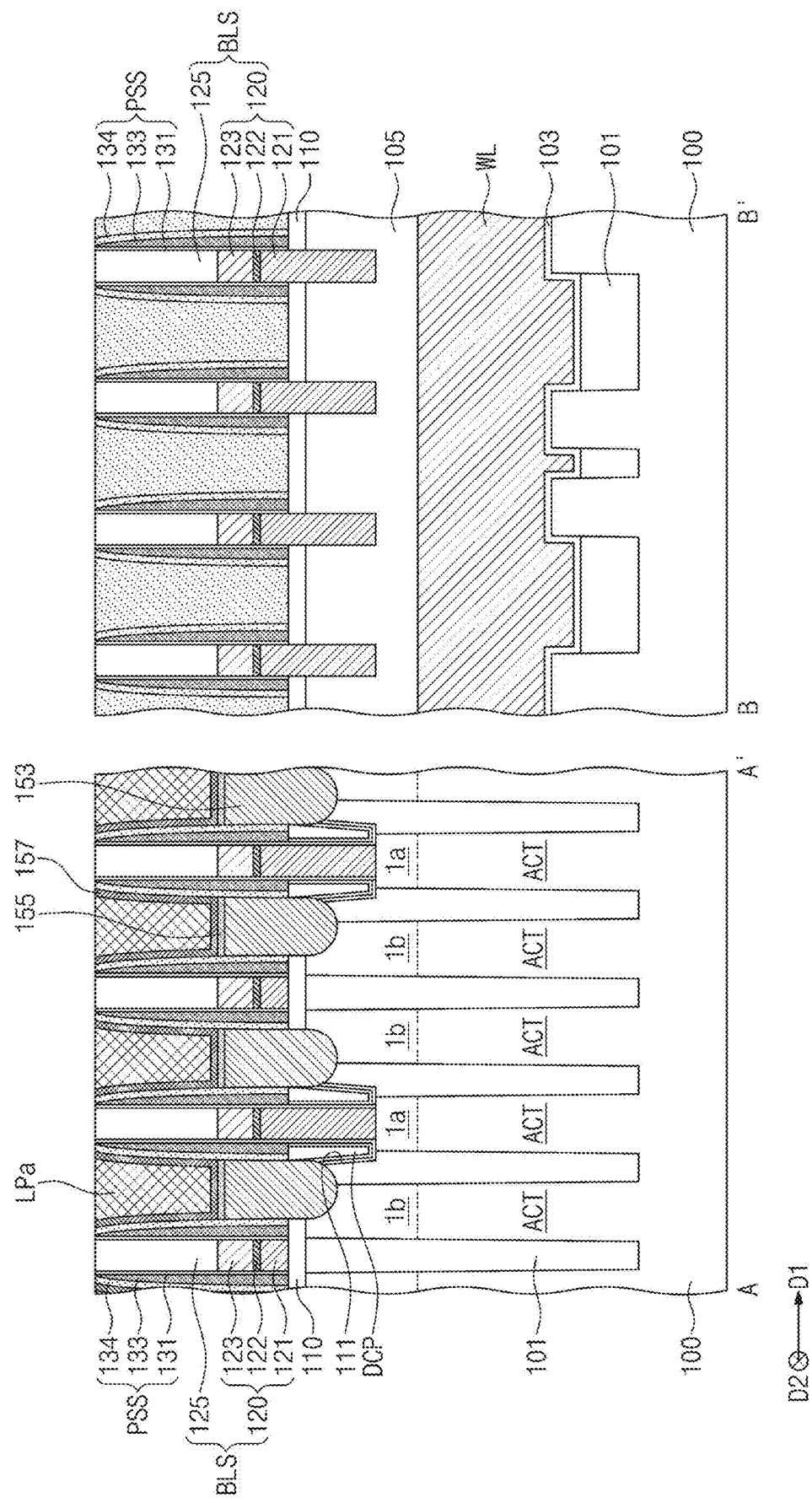
Figure 9C:
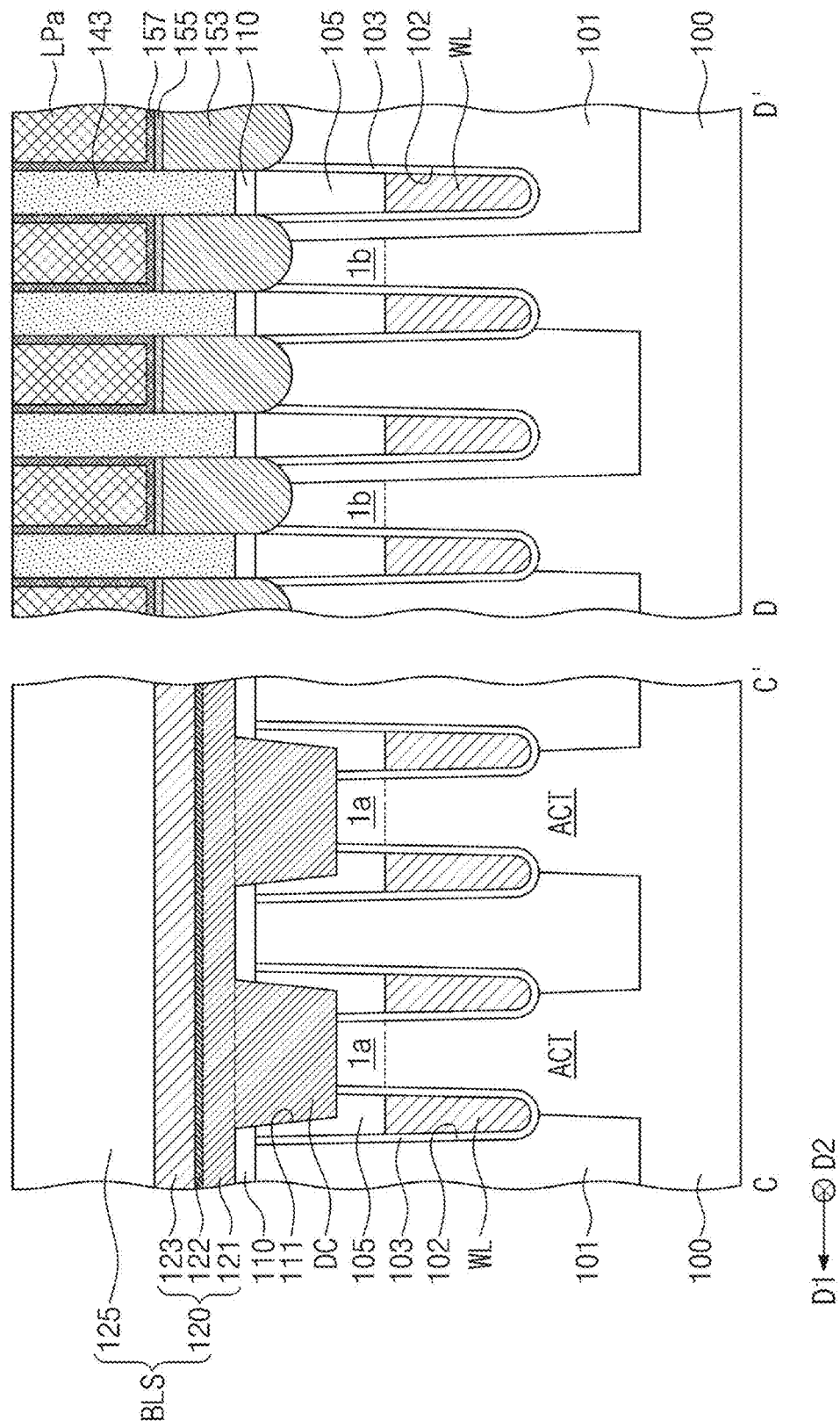

Referring to FIGS. 9A, 9B, and 9C, storage node contacts 153 may be formed to fill lower portions of the contact holes 145. The formation of the storage node contacts 153 may include depositing a conductive layer filling the contact holes 145, planarizing the conductive layer to expose the top surfaces of the bit line structures BLS and of the dielectric patterns 143, and recessing a top surface of the conductive layer. In certain example embodiments, the storage node contact 153 may have a top surface lower than that of the bit line capping pattern 125 of the bit line structure BLS. The storage node contact 153 may include, for example, one or more of a doped semiconductor material (e.g., doped silicon), a metallic material (e.g., tungsten, aluminum, titanium, or tantalum), a conductive metal nitride material (e.g., titanium nitride, tantalum nitride, or tungsten nitride), and a metal-semiconductor compound (e.g., metal silicide).

A contact silicide pattern 155 may be formed on the top surface of the storage node contact 153. The contact silicide pattern 155 may be formed by reaction of a metallic material and the top surface of the storage node contact 153. The contact silicide pattern 155 may be formed of at least one of, for example, titanium silicide, cobalt silicide, nickel silicide, tungsten silicide, platinum silicide, or molybdenum silicide. Alternatively, no contact silicide pattern 155 may be formed.

Lower landing pads LPa may be formed to fill upper portions of the contact holes 145 and to have connection with corresponding storage node contacts 153, and barrier patterns 157 may be formed to surround lateral and bottom surfaces of the lower landing pads LPa.

The formation of the lower landing pads LPa and the barrier patterns 157 may include conformally depositing a barrier layer on the entire surface of the semiconductor substrate 100, forming on the barrier layer a metal layer filling remaining portions of the contact holes 145, and etching the metal layer to form the lower landing pads LPa arranged along the first and second directions D1 and D2. While the metal layer is etched, the barrier layer on the bit line structure BLS may also be etched to expose the top surface of the bit line structure BLS. In certain example embodiments, the barrier layer may not be etched together with the metal layer, but may remain on the bit line structure BLS. Accordingly, the barrier layer on the bit line structure BLS may be removed by a planarization process which will be discussed with reference to FIGS. 10A to 10C.

Figure 10A:
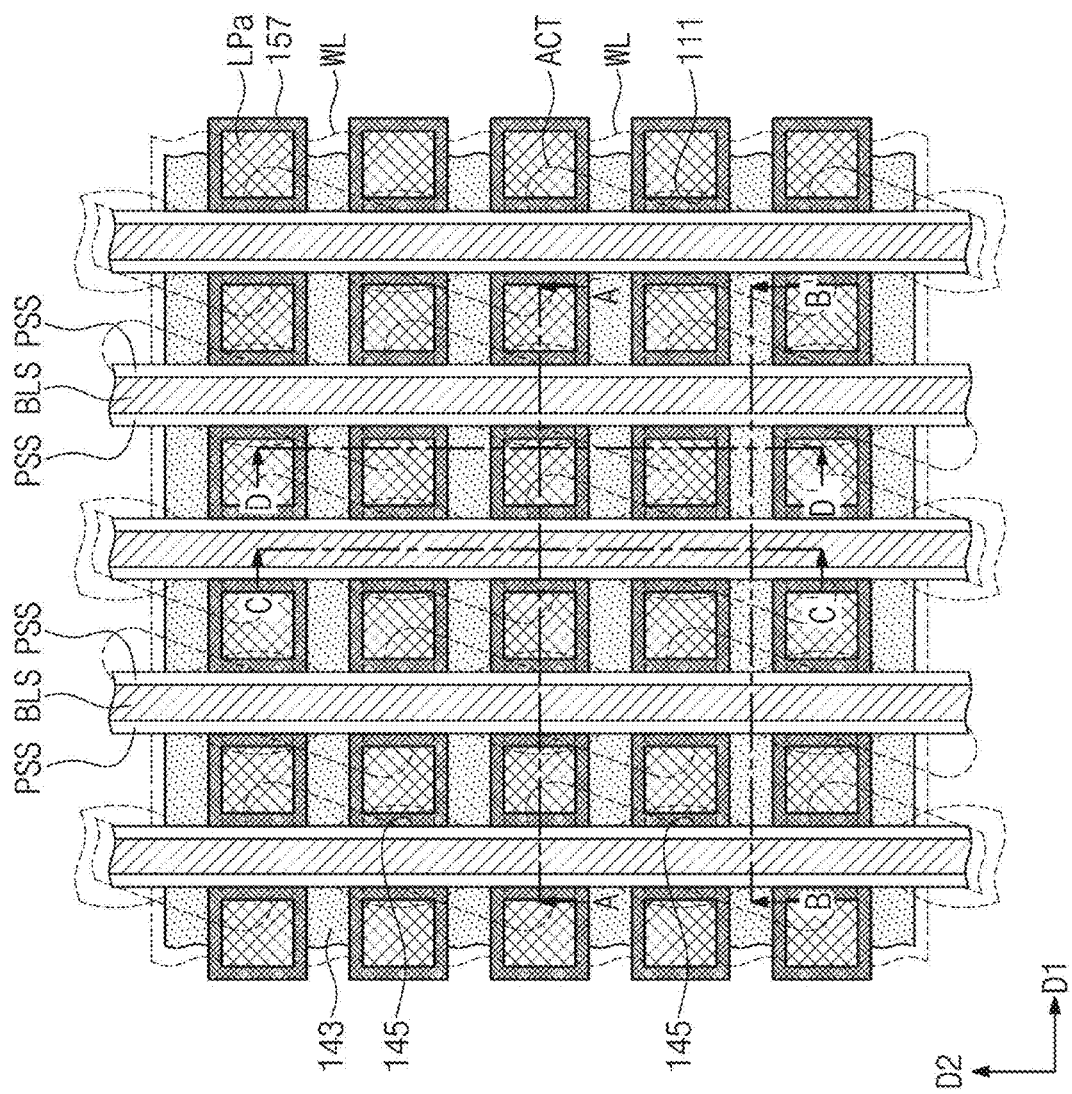
Figure 10B:
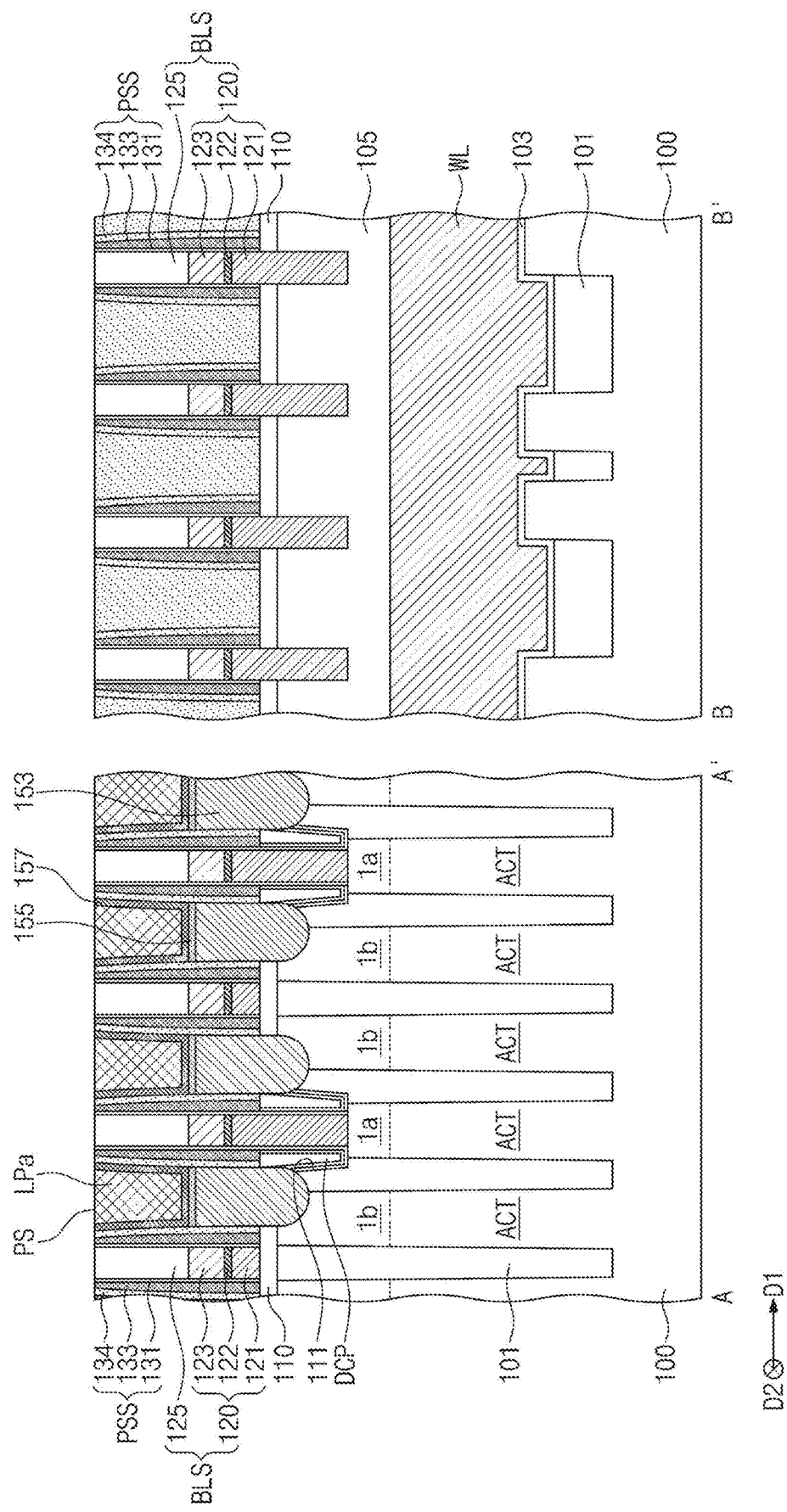
Figure 10C:
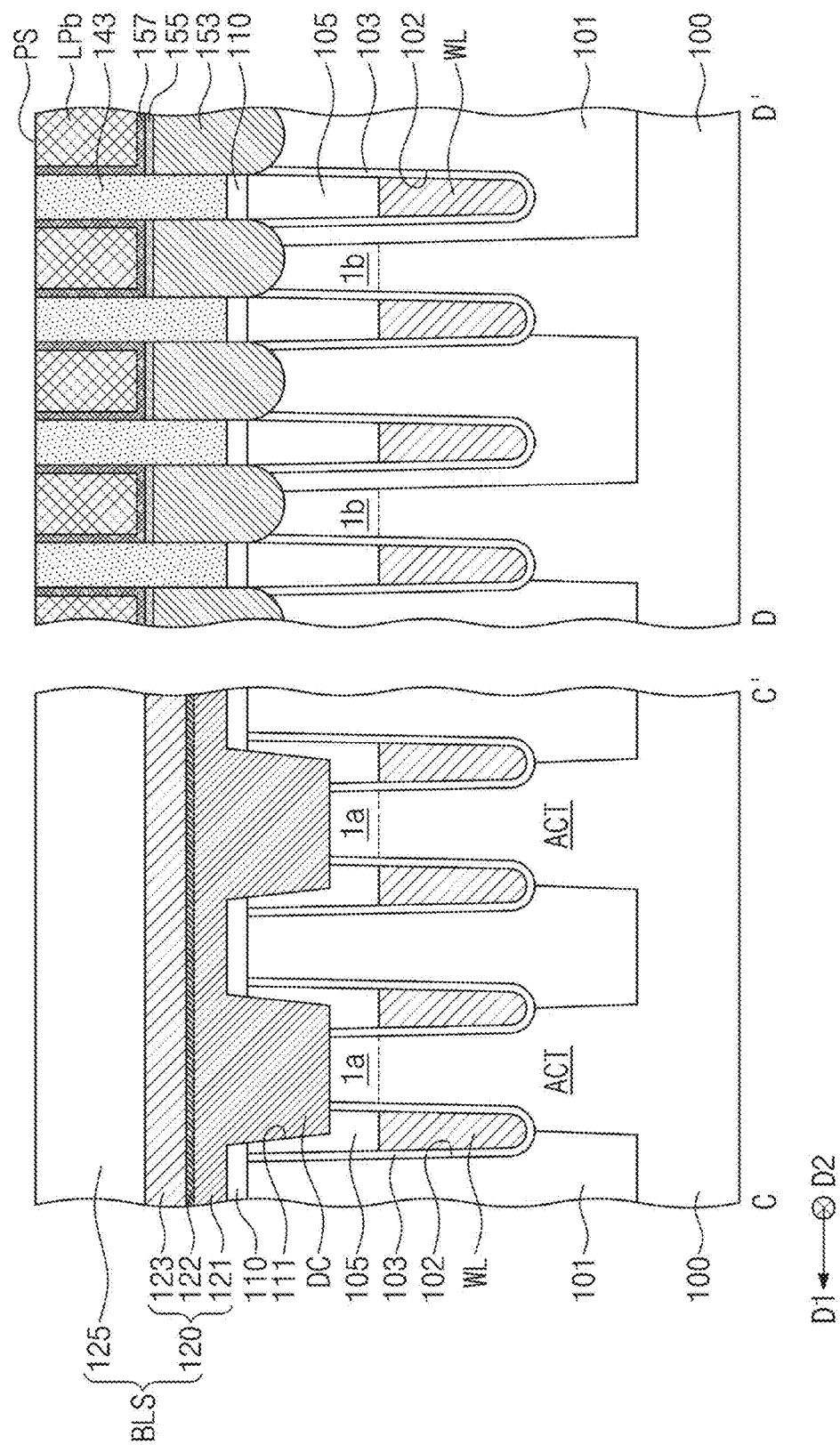

Referring to FIGS. 10A, 10B, and 10C, a planarization process may be performed on the semiconductor substrate 100. The planarization process may include a chemical mechanical polishing (CMP) process. A CMP slurry may include abrasive particles, an oxidizer, and a PH adjuster to polish a metal layer, such as the lower landing pad LPa. A height of each of the bit line structure BLS and the lower landing pad LPa may be reduced due to the planarization process. The sacrificial spacer 133 may have a top surface, exposed between the first spacer 131 and the second spacer 134, whose width in the first direction D1 may increase as the planarization process progresses. In contrast, as shown in FIG. 10B, the lower landing pad LPa may have a top surface whose width in the first direction D1 may decrease as the planarization process progresses. As shown in FIG. 10C, the top surface of the lower landing pad LPa may have a uniform width in the second direction D2. In certain example embodiments, before the planarization process is performed, the top surface of the sacrificial spacer 133 may be covered with the first spacer 131 and/or the second spacer 134. Accordingly, the top surface of the sacrificial spacer 133 may be exposed by the planarization process.

Figure 11A:
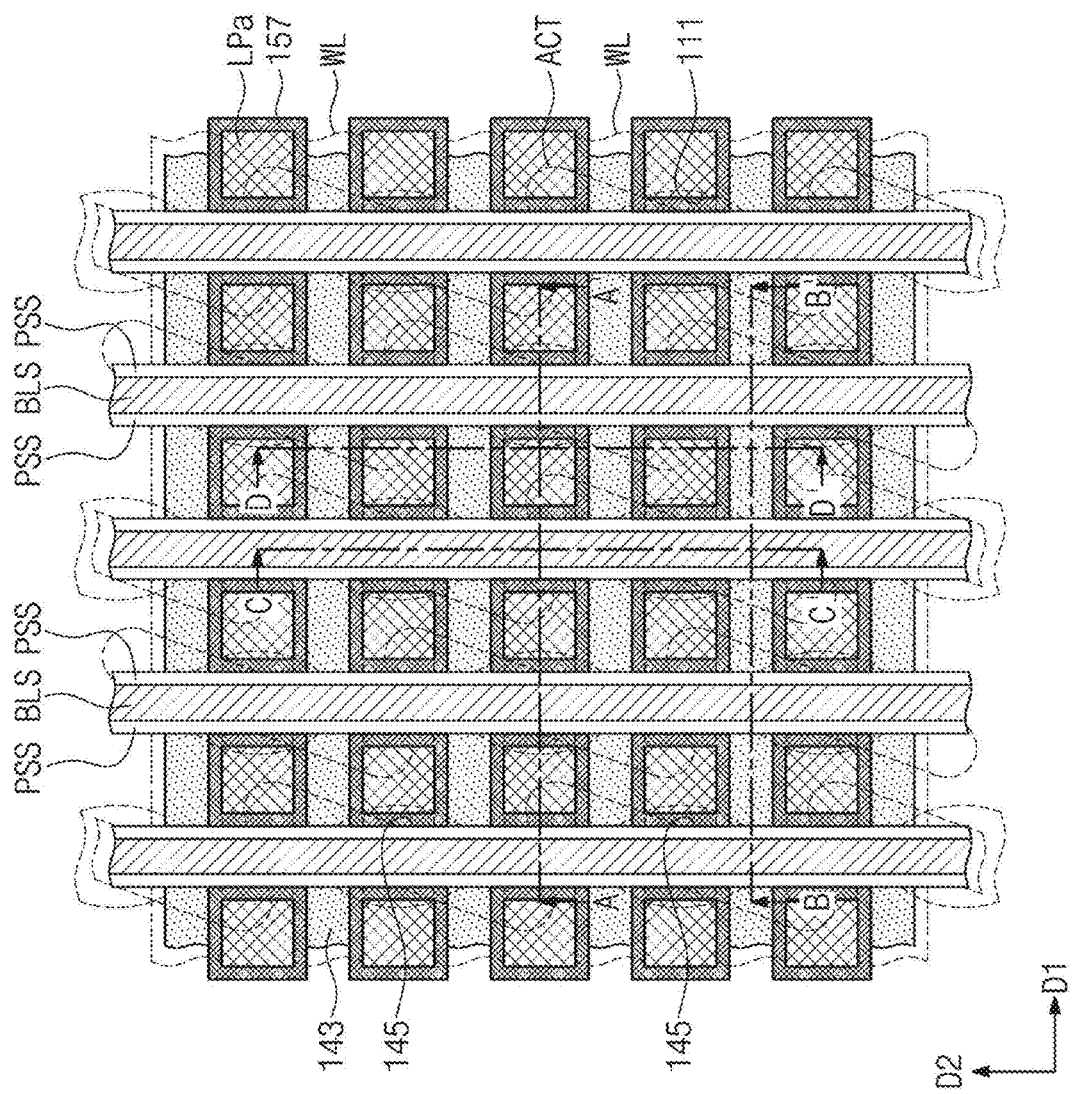
Figure 11B:
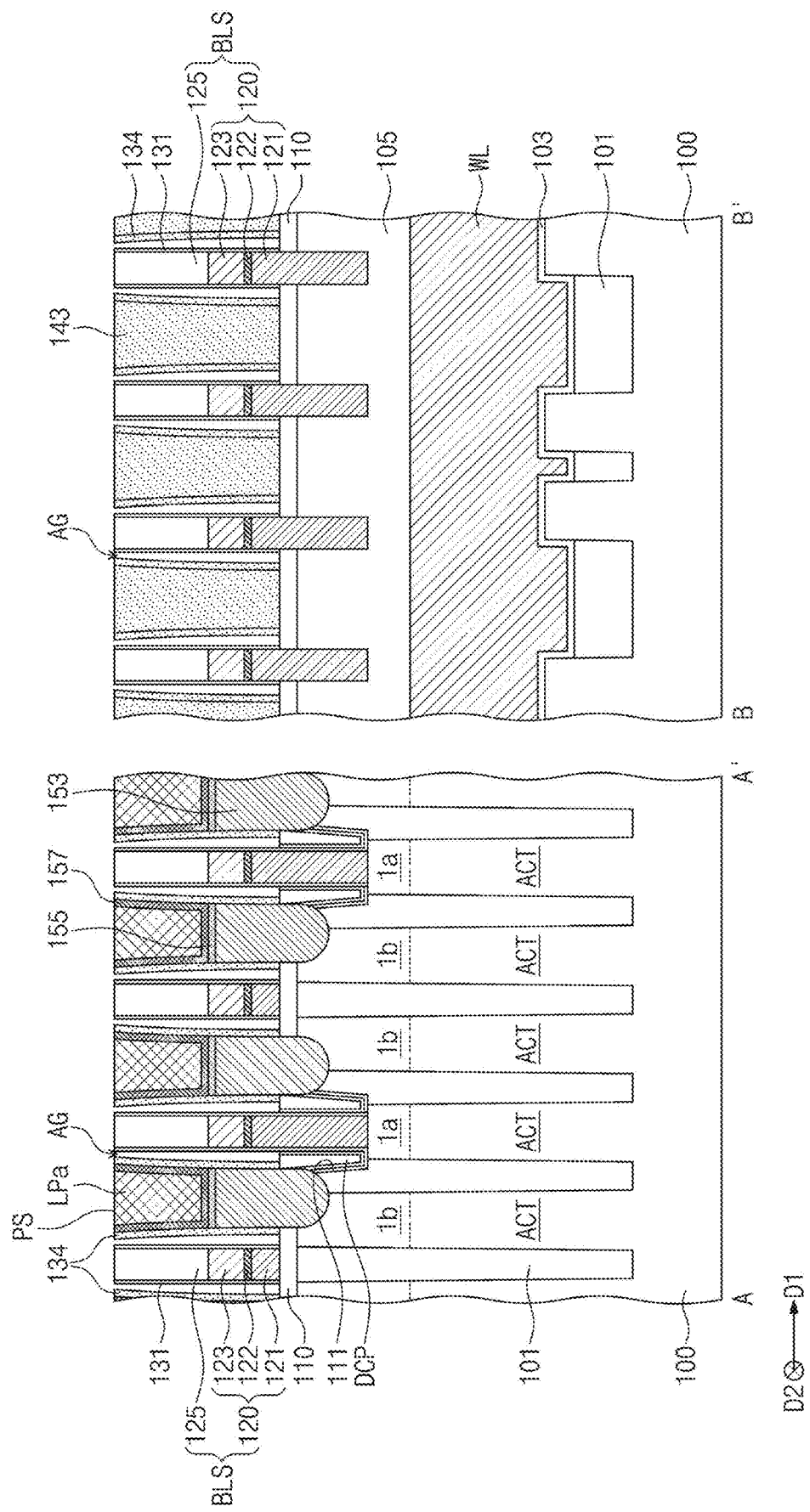
Figure 11C:
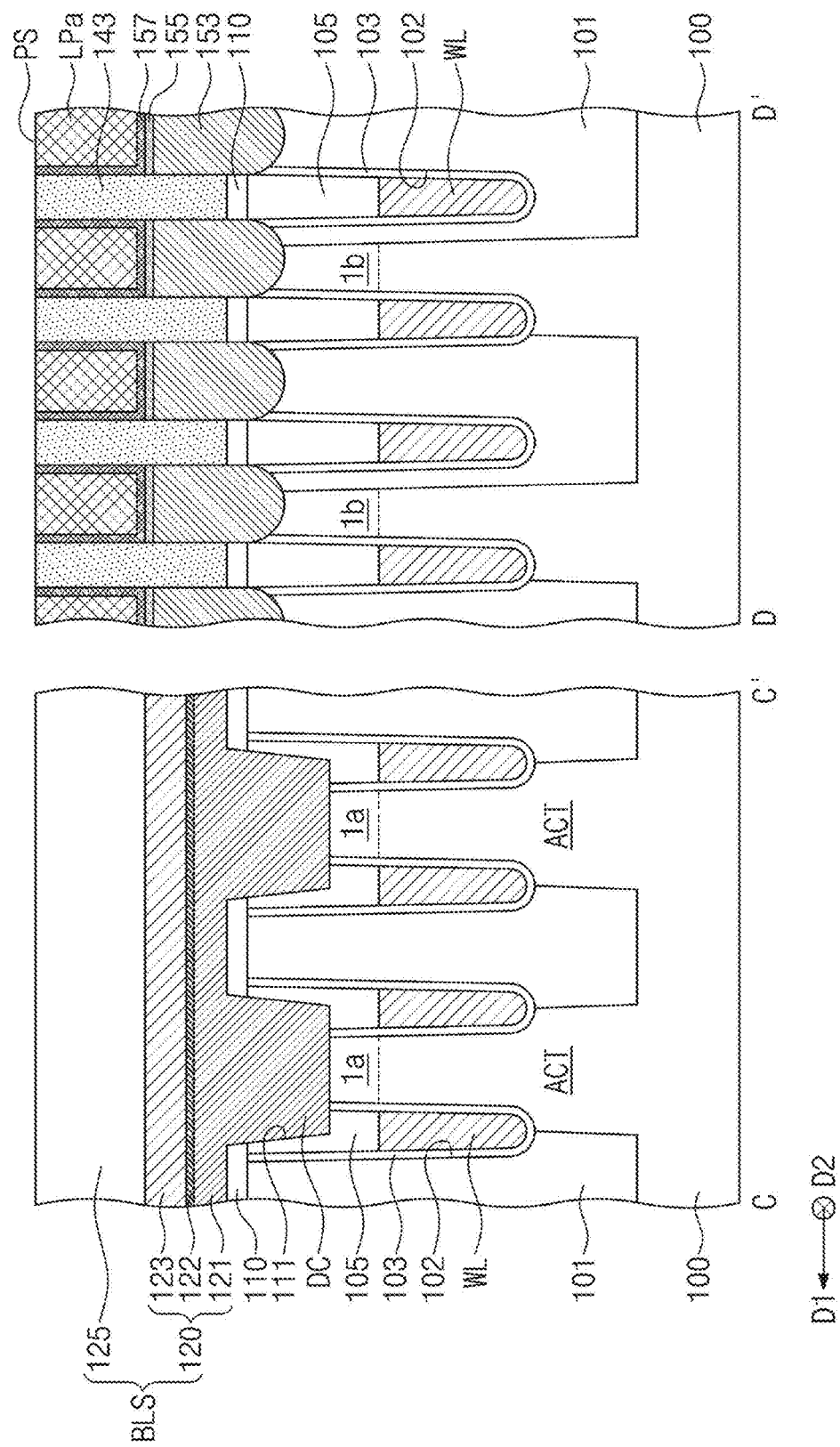

Referring to FIGS. 11A, 11B, and 11C, the sacrificial spacer 133 may be removed to form an air gap AG between the first spacer 131 and the second spacer 134. The formation of the air gap AG may include performing an ashing process on the exposed top surface of the sacrificial spacer 133. The formation of the air gap AG may also include etching the sacrificial spacer 133 by providing an etchant onto the top surface of the sacrificial spacer 133. For example, the formation of the air gap AG may include etching the sacrificial spacer 133 with a wet etchant chemistry, such as buffered hydrogen fluoride and/or sulfuric acid; however, inventive concepts are not limited thereto.

Figure 12A:
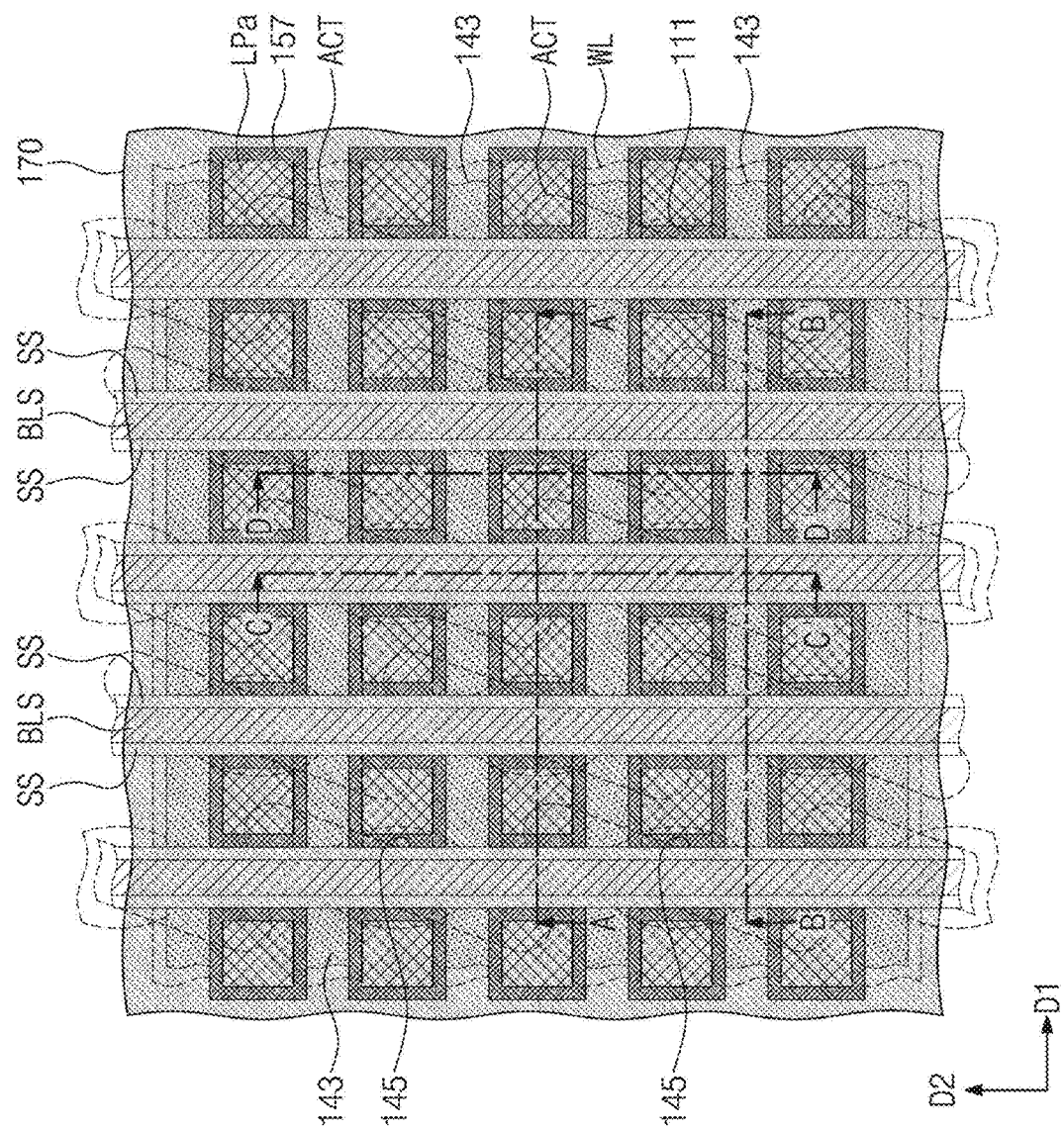
Figure 12B:
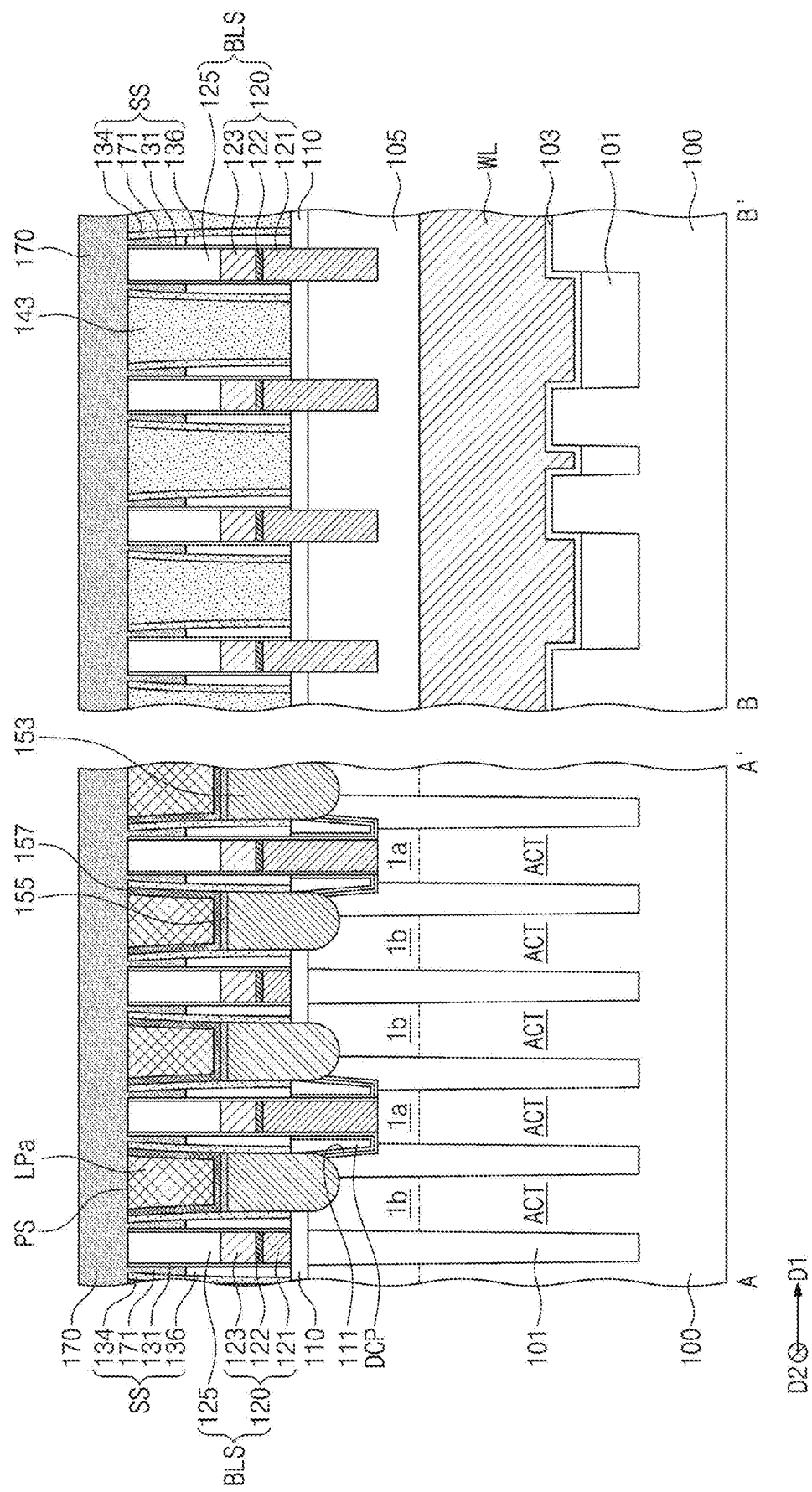
Figure 12C:
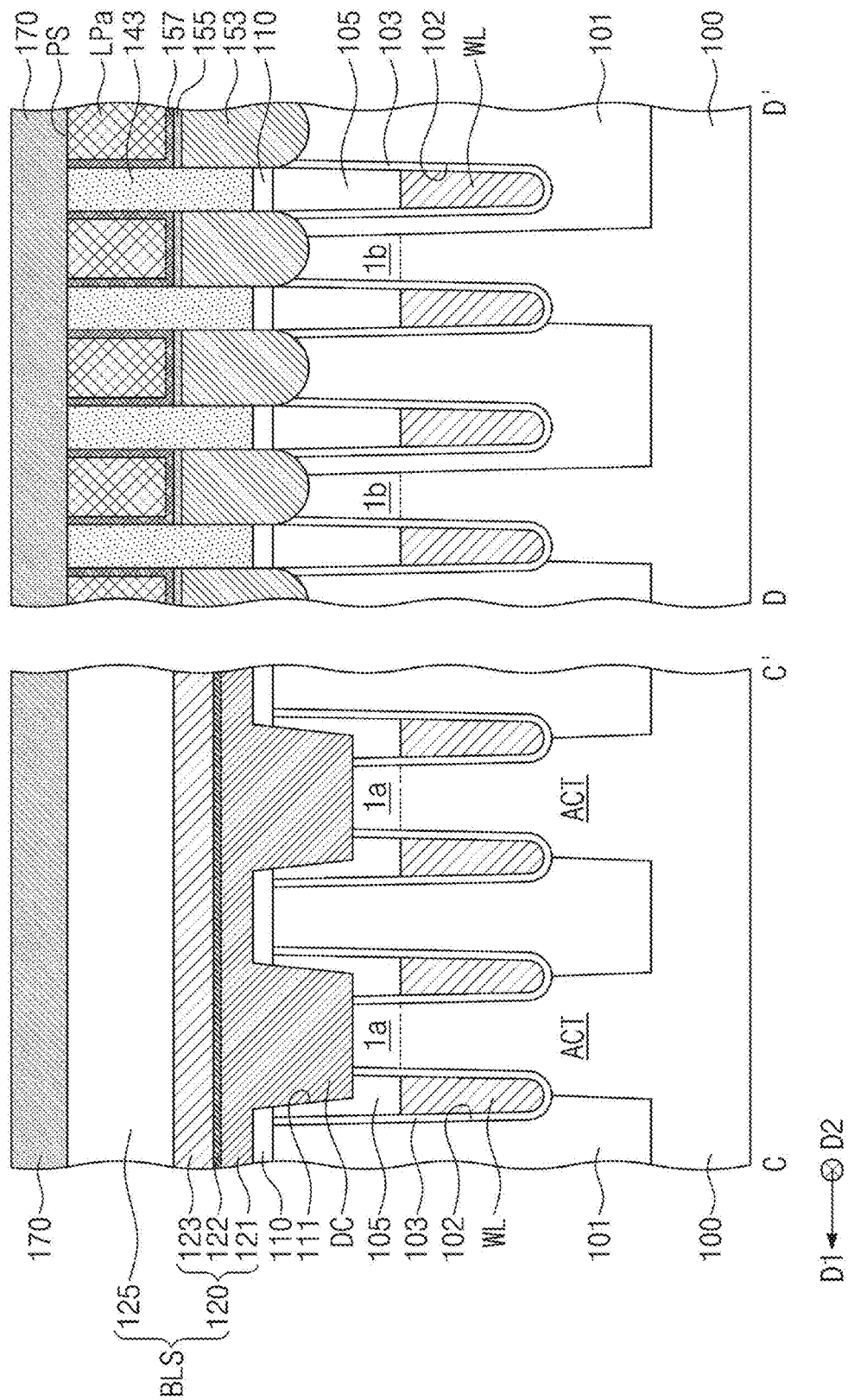

Referring to FIGS. 12A, 12B, and 12C, a second interlayer dielectric layer 170 may be formed on the entire surface of the semiconductor substrate 100. The second interlayer dielectric layer 170 may cover the top surfaces of the bit line structure BLS, the lower landing pad LPa, and the dielectric pattern 143. The formation of the second interlayer dielectric layer 170 may include performing a deposition process on the entire surface of the semiconductor substrate 100 to allow the second interlayer dielectric layer 170 to have superior gap-fill characteristics. For example, the deposition process may include performing atomic layer deposition (ALD) that uses a precursor including dichlorosilane (DCS, e.g. $SiH_2Cl_2$). Alternatively or additionally, the deposition process may include performing plasma enhanced chemical vapor deposition (PECVD) using silicon carbonitride (SiCN). Alternatively or additionally, the deposition process may include performing high-density plasma chemical vapor deposition (HDPCVD). While the second interlayer dielectric layer 170 is formed, a spacer capping pattern 171 may also be formed extending from a bottom surface of the second interlayer dielectric layer 170 toward a space between the first spacer 131 and the second spacer 134. The spacer capping pattern 171 and the second interlayer dielectric layer 170 may be connected into a single body.

As the spacer capping pattern 171 is formed, an air spacer 136 may be defined between the first spacer 131 and the second spacer 134 and below the spacer capping pattern 171. Therefore, the bit line structure BLS may be provided on its sidewall with a spacer structure SS including the first spacer 131, the second spacer 134, the air spacer 136, and the spacer capping pattern 171. A top end of the air spacer 136 and/or a bottom end of the spacer capping pattern 171 may be located at a higher level than that of a top surface of the metal pattern 123. The air spacer 136 may have a vertical height greater than that of the spacer capping pattern 171.

Referring back to FIGS. 1A, 1B, and 1C, an upper landing pad LPb may be formed which penetrates the second interlayer dielectric layer 170 and has connection with the lower landing pad LPa.

For example, the second interlayer dielectric layer 170 may undergo an anisotropic etching process to form isolation trenches NSR exposing portions of the lower landing pads LPa. When viewed in plan, the isolation trenches NSR may be arranged in a zigzag shape or in a honeycomb shape. The isolation trench NSR may expose not only the portion of the lower landing pad LPa, but a portion of the bit line capping pattern 125 and a portion of the spacer structure SS. A metal layer (not shown) may be formed to fill the isolation trenches NSR, and a planarization process may be performed to form the upper landing pads LPb that are node-separated from each other. The upper landing pads LPb may have their top surfaces coplanar with that of the second interlayer dielectric layer 170.

According to some example embodiments of inventive concepts, a semiconductor memory device may be provided which has improved reliability and is more easily fabricated.

Although inventive concepts have been described in connection with some example embodiments of inventive concepts illustrated in the accompanying drawings, it will be understood to those of ordinary skill in the art that various changes and modifications may be made without departing from the technical spirit and essential feature of inventive concepts. It will be apparent to those of ordinary skill in the art that various substitution, modifications, and changes may be thereto without departing from the scope and spirit of inventive concepts.

What is claimed is:

1. A semiconductor memory device, comprising:
a substrate;
a bit line structure extending in one direction on the substrate, the bit line structure including a sidewall;
a storage node contact on the sidewall of the bit line structure;
first and second spacers between the sidewall of the bit line structure and the storage node contact, the first spacer separated from the second spacer by a space between the first spacer and the second spacer;
an interlayer dielectric layer on the bit line structure, the interlayer dielectric layer including a bottom surface;
a spacer capping pattern extending downward from the bottom surface of the interlayer dielectric layer toward the space between the first and second spacers; and a landing pad structure penetrating the interlayer dielectric layer, the landing pad structure coupled to the storage node contact, wherein the spacer capping pattern has a width that increases with increasing distance from the bottom surface of the interlayer dielectric layer.

2. The semiconductor memory device of claim 1, wherein the first and second spacers define an air spacer therebetween, the air spacer below the spacer capping pattern.

3. The semiconductor memory device of claim 1, wherein the landing pad structure includes:
a protrusion protruding toward the substrate, the protrusion contacting the spacer capping pattern.

4. The semiconductor memory device of claim 1, wherein the landing pad structure includes a protrusion protruding toward the substrate; and
a bottom end of the protrusion is at a vertical level between the bottom surface of the interlayer dielectric layer and a bottom end of the spacer capping pattern.

5. The semiconductor memory device of claim 1, wherein the landing pad structure includes a protrusion protruding toward the substrate; and
a bottom end of the protrusion is on one of the first spacer, the second spacer, or the spacer capping pattern.

6. The semiconductor memory device of claim 1, wherein the landing pad structure includes a flat region in contact with the bottom surface of the interlayer dielectric layer.

7. The semiconductor memory device of claim 1, wherein the bit line structure includes a bit line and a bit line capping pattern on the bit line, and
the landing pad structure is in contact with the bit line capping pattern.

8. The semiconductor memory device of claim 1, wherein a top surface of the landing pad structure is at a same level as a top surface of the interlayer dielectric layer.

9. The semiconductor memory device of claim 1, wherein a bottom end of the spacer capping pattern is at a higher level than a top surface of the storage node contact.

10. The semiconductor memory device of claim 1, wherein the spacer capping pattern corresponds to a portion of interlayer dielectric layer that partially fills the space between the first spacer and the second spacer.

11. A semiconductor memory device, comprising:
a substrate including a first active region and a second active region, the first active region and the second active region spaced apart from each other;
a bit line structure coupled to the first active region, the bit line structure running across the substrate, the bit line structure include a sidewall;
a spacer structure on the sidewall of the bit line structure;
an interlayer dielectric layer on the bit line structure and the spacer structure; and
a landing pad structure penetrating the interlayer dielectric layer and electrically connected to the second active region, the landing pad structure including a protrusion protruding toward the substrate, and a bottom end of the protrusion being located at a level lower than a top end of the spacer structure, wherein
the landing pad structure includes a flat region parallel to a top surface of the substrate; and
the flat region is between a bottom surface of the interlayer dielectric layer and a bottom surface of the landing pad structure.

12. The semiconductor memory device of claim 11, wherein
the bit line structure includes,
a bit line, and
a bit line capping pattern on the bit line, and
the protrusion is in contact with the bit line capping pattern.

13. The semiconductor memory device of claim 11, wherein a top surface of the landing pad structure is at a same level as a top surface of the interlayer dielectric layer.

14. The semiconductor memory device of claim 11, wherein the bottom end of the protrusion is on the spacer structure.

15. A semiconductor memory device, comprising:
a substrate;
a pair of bit line structures on the substrate, the pair of bit line structures extending in parallel along one direction;
a storage node contact between the pair of bit line structures;
a lower landing pad between the pair of bit line structures, the lower landing pad on the storage node contact;
an interlayer dielectric layer on the pair of bit line structures and the lower landing pad, the interlayer dielectric layer including a bottom surface; and
an upper landing pad penetrating the interlayer dielectric layer and coupled to the lower landing pad, the upper landing pad having a bottom end at a level lower than the bottom surface of the interlayer dielectric layer,
wherein the bottom end of the upper landing pad is spaced apart from the lower landing pad, and
the bottom end of the upper landing pad is at a lower level than an upper surface of the lower landing pad.

16. The semiconductor memory device of claim 15, further comprising:
a barrier pattern between the lower landing pad and the pair of bit line structures; and wherein
an uppermost surface of the barrier pattern is at a same level as the bottom surface of the interlayer dielectric layer.

17. The semiconductor memory device of claim 15, wherein a top surface of the lower landing pad is in contact with the bottom surface of the interlayer dielectric layer.

18. The semiconductor memory device of claim 15, wherein at least a portion of the upper landing pad vertically overlaps the bit line structure.

19. The semiconductor memory device of claim 15, wherein a bottom end of the upper landing pad is between the bit line structure and the lower landing pad.

* * * * *